US008941963B2

(12) United States Patent
Souma

(10) Patent No.: US 8,941,963 B2
(45) Date of Patent: Jan. 27, 2015

(54) SEMICONDUCTOR DEVICE

(71) Applicant: Renesas Electronics Corporation, Kawasaki-shi, Kanagawa (JP)

(72) Inventor: Osamu Souma, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 50 days.

(21) Appl. No.: 13/908,613

(22) Filed: Jun. 3, 2013

(65) Prior Publication Data

US 2013/0332750 A1 Dec. 12, 2013

(30) Foreign Application Priority Data

Jun. 7, 2012 (JP) ................. 2012-130081

(51) Int. Cl.
*H02H 9/02* (2006.01)
*H02H 3/08* (2006.01)

(52) U.S. Cl.
CPC ..................................... *H02H 3/08* (2013.01)
USPC ......................................................... 361/93.1

(58) Field of Classification Search
USPC ......................................................... 361/93.1
See application file for complete search history.

(56) References Cited

U.S. PATENT DOCUMENTS

| 6,717,785 | B2 | 4/2004 | Fukuda et al. | |
|---|---|---|---|---|
| 7,030,769 | B2 * | 4/2006 | Miller | 340/635 |
| 7,079,368 | B2 | 7/2006 | Ishikawa et al. | |
| 7,154,240 | B2 * | 12/2006 | Watanabe | 318/434 |
| 7,834,669 | B2 | 11/2010 | Nakahara | |
| 8,315,028 | B2 * | 11/2012 | Ohshima | 361/94 |
| 8,325,451 | B2 | 12/2012 | Mitsuda | |
| 8,373,484 | B2 | 2/2013 | Kudo et al. | |
| 2008/0043393 | A1 * | 2/2008 | Petkov | 361/103 |
| 2010/0290167 | A1 * | 11/2010 | Vandergrift | 361/101 |
| 2011/0163794 | A1 | 7/2011 | Soma et al. | |

FOREIGN PATENT DOCUMENTS

| JP | 2011-160747 A | 6/2001 |
|---|---|---|
| JP | 2001-345688 A | 12/2001 |
| JP | 2003-111264 A | 4/2003 |
| JP | 2009-171551 A | 7/2009 |
| JP | 2009-212704 A | 9/2009 |
| JP | 2011-139404 A | 7/2011 |

* cited by examiner

*Primary Examiner* — Scott Bauer
(74) *Attorney, Agent, or Firm* — Foley & Lardner LLP

(57) ABSTRACT

A first overcurrent detection unit detects whether a drain-source voltage of an output transistor is greater than or equal to a first reference value and outputs a first detection signal. A second overcurrent detection unit detects whether an output current passing through the output transistor is greater than or equal to a second reference value and outputs a second detection signal. When receiving the first detection signal indicating that the drain-source voltage is greater than or equal to the first reference value, a latch circuit latches the second detection signal; when receiving the first detection signal indicating that the drain-source voltage is smaller than the first reference value, the latch circuit outputs the second detection signal without latching it. Based on the output of the latch circuit, the drive circuit controls the output transistor to either turn it off or turn it on and off alternately.

11 Claims, 13 Drawing Sheets

SEMICONDUCTOR DEVICE

CROSS-REFERENCE TO RELATED APPLICATIONS

The disclosure of Japanese Patent Application No. 2012-130081 filed on Jun. 7, 2012 including the specification, drawings and abstract is incorporated herein by reference in its entirety.

BACKGROUND

The present invention relates to a semiconductor device. This semiconductor device can be suitably used, for example, as intelligent power device (IPD).

There are known intelligent power devices (IPDs) for automobile electrical system. An IPD includes current limit and current interrupt functions for protecting the device or harness when an abnormality, such as a load short-circuit, occurs. As used herein, the current limit function refers to a function of limiting the magnitude of the output current. The current interrupt function refers to a function of interrupting an excessive output current (overcurrent).

For example, Japanese Unexamined Patent Application Publication No. 2001-160747 discloses a semiconductor switching device having current limit and current interrupt functions. This semiconductor switching device includes a semiconductor switching element, overcurrent detection means, and load current control means. The semiconductor switching element provides or interrupts the power supply to the load. The overcurrent detection means detects an overcurrent by comparing a detected load current value with a first overcurrent reference value for determining an overcurrent state or with a second overcurrent reference value which is greater than the first overcurrent reference value and which is intended to determine a large overcurrent. The load current control means performs overcurrent interrupt control, that is, turns off the semiconductor switching element when the detected current value is greater than the second overcurrent reference value, that is, indicates a large overcurrent. The load current limit means also performs current limit control, that is, alternately turns on and off the semiconductor switching element to limit the load current when the detected current value is greater than the first overcurrent reference value and smaller than the second overcurrent reference value, that is, indicates a medium current.

A related-art example is a power supply switch circuit disclosed in Japanese Unexamined Patent Application Publication No. 2009-212704. This power supply switch circuit includes an output transistor, an output control unit, a sense transistor, an output current detection terminal, and a short-circuit detection unit. The output transistor is coupled between a power source terminal and an output terminal. The output control unit controls the conduction state of the output transistor in accordance with an input signal. The gate of the sense transistor is coupled to the gate of the output transistor so that the sense transistor detects an output current flowing into the output transistor. The output current detection terminal generates a detection voltage corresponding to the output current detected by the sense transistor. The short-circuit detection unit detects the short-circuit state of the output current detection terminal on the basis of the detection voltage and outputs a short-circuit control signal for stopping the output transistor or limiting the output current.

Japanese Unexamined Patent Application Publication No. 2001-345688 discloses a semiconductor switching element drive circuit. This semiconductor switching element drive circuit includes a semiconductor switching element 4, an overcurrent protection circuit 20, and a current limit circuit 10. The semiconductor switching element 4 includes a gate terminal 4a, a first terminal 4b, and a second terminal 4c, and applies a voltage to the gate terminal to pass the principal current between the first and second terminals. When the principal current is an overcurrent which has exceeded a predetermined current value i2 for a predetermined period of time or more, the overcurrent protection circuit 20 first reduces the principal current on a first slope and then reduces the principal current on a second slope, which is steeper than the first slope. When the principal current becomes a larger current than the overcurrent within a shorter period of time than the predetermined period of time, the current limit circuit 10 instantly reduces the voltage of the gate terminal.

Japanese Unexamined Patent Application Publication No. 2003-111264 discloses a power supply device having an overcurrent protection function, a load drive device, and power supply device for vehicle. This power supply device includes a semiconductor element 10, current detection means 13, and current limit means 14. The semiconductor element sends a current to the power receiving side via a wire. The current detection means 13 detects the current passing through the wire. When the current detected by the current detection means exceeds a current limit threshold, the current limit means 14 controls the semiconductor element to limit the current passing through the wire to the current limit threshold or less. The current limit threshold is set to the current value or less in accordance with wire burn-out characteristics, which indicate time-varying characteristics of the current value with which the wire burns out due to the current passing through the wire.

Japanese Unexamined Patent Application Publication Nos. 2009-171551 (US2009160498(A1)) and 2011-139404 (US2011163794(A1)) disclose circuits for discharging the gate charge of an output transistor.

SUMMARY

In Japanese Unexamined Patent Application Publication No. 2001-160747, the current limit function works after timer time of 1 msec elapses. When 30 A is reached before timer time of 1 msec elapses, the current interrupt function alone works. Thus, the current is interrupted within 1 msec in a completely short-circuit state. As a result, the device or the like is protected with low loss. However, the current interrupt function does not work in a partially short-circuit state, for example, when a current of 25 A passes through the load. The current limit function also does not work unless timer time of 1 msec elapses. For this reason, significant loss occurs in the device or the like. Accordingly, it is desired to provide a technology which can protect the device or the like with low loss regardless of the extent to which the load is short-circuited.

Other problems and novel features will be apparent from the description of the present specification and the accompanying drawings.

According to one embodiment, the current limit function, which works in accordance with the magnitude of the output current, and the overcurrent interrupt function, which works in accordance with the magnitude of the drain-source voltage, are provided as functions for protecting the output transistor.

According to the embodiment, the device or the like can be protected with low loss, regardless of the extent to which the load is short-circuited.

DETAILED DESCRIPTION

Now, semiconductor devices according to embodiments will be described with reference to the accompanying drawings.

First Embodiment

Figure 1:
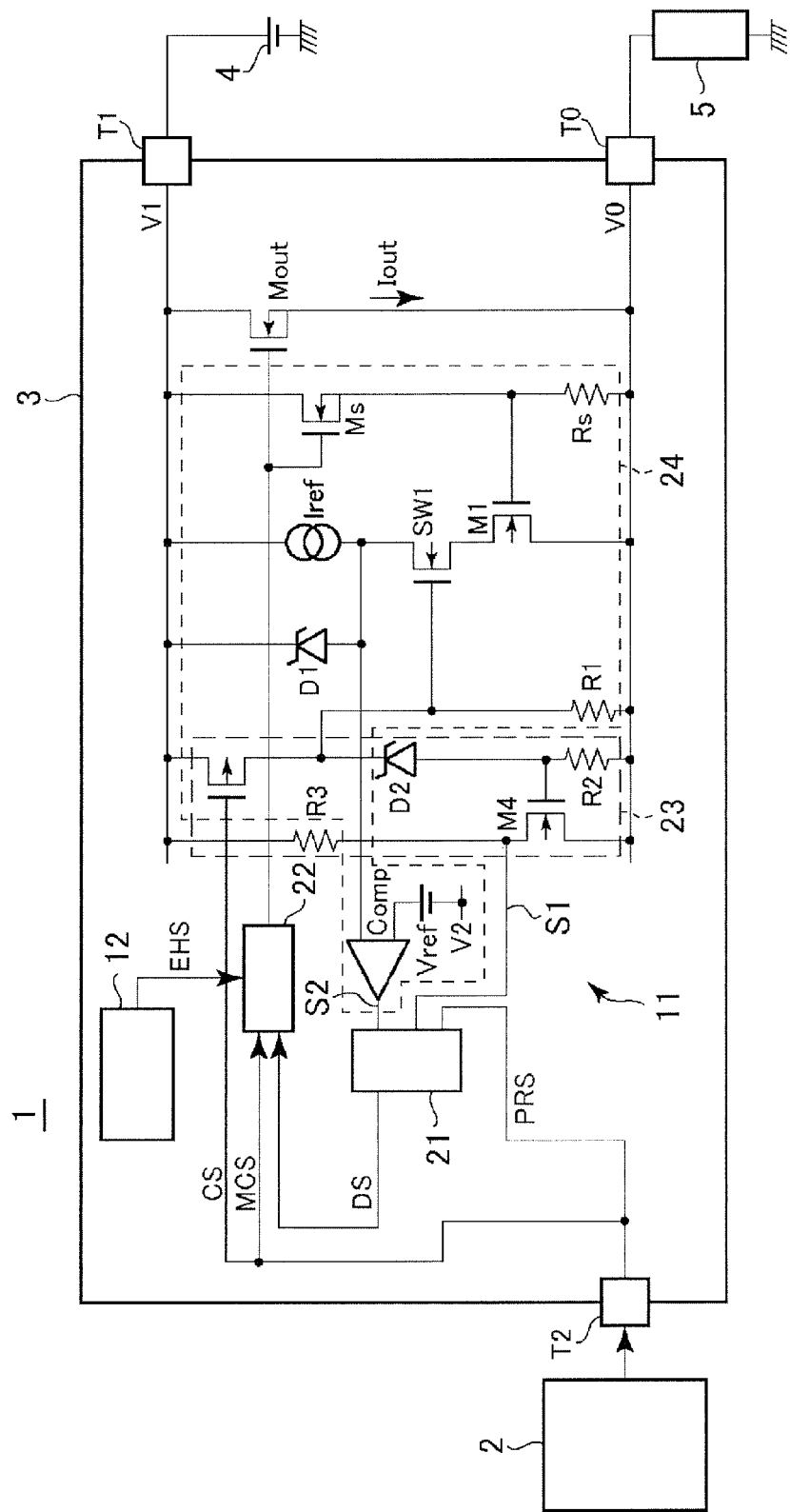
FIG. 1 is a block diagram showing the configuration of a semiconductor device and an example use thereof according to a first embodiment.

First, the configuration of a semiconductor device according to a first embodiment will be described. FIG. 1 is a block diagram showing the configuration of the semiconductor device and an example use thereof according to the first embodiment. A semiconductor device 3 is an intelligent power device (IPD) including one or more semiconductor chips. The semiconductor device 3 in this example use (electrical system 1) includes a terminal T2 coupled to a microcomputer 2, a first terminal T1 coupled to a power source 4, and a second terminal T0 coupled to a load 5. The semiconductor device 3 controls the power supply from the power source 4 to the load based on the control of the microcomputer 2. Where an electrical system 1 is an automobile electrical system, the power source 4 is, for example, the battery of the automobile, and the load 5 is, for example, the lamp or motor thereof. The semiconductor device 3 is coupled to the high side of the load 5. In the electrical system 1 as described above, the configuration and operation of the semiconductor device 3 (to be discussed later) allows the device to be protected with low loss regardless of the state of the load.

The semiconductor device 3 will be described in detail. The semiconductor device 3 includes a power control circuit 11 and an overheat detection circuit 12. The power control circuit 11 controls the power supply from the power source 4 to the load 5 based on the control of the microcomputer 2. The power control circuit 11 also includes a function of interrupting the current from the power source 4 to the load 5 depending on the state of the load 5 (current interrupt function) and a function of limiting the current from the power source 4 to the load 5 depending on the state of the load 5 (current limit function). Examples of the state of the load 5 include a heavily short-circuit state, in which the load is short-circuited severely, and a partially short-circuit state, in which the load is not short-circuited heavily but in which the resistance value of the load falls below a normal range and an overcurrent flows. In this diagram, the power control circuit 11 passes without change (normal operation), interrupts (abnormal operation: heavily short-circuit state), or limits (abnormal operation: partially short-circuit state) the current from the power source 4 coupled to the first terminal T1 to the load 5 coupled to the second terminal T0. Details of the power control circuit 11 will be described later.

The overheat detection circuit 12 monitors the temperature of an output transistor Mout (to be discussed later) of the power control circuit 11 using a temperature sensor (not shown) disposed near the output transistor Mout. When the overheat detection circuit 12 detects that the temperature of the output transistor Mout is greater than or equal to a predetermined temperature, it outputs an overheat protection signal EHS to the power control circuit 11. In response to the overheat protection signal EHS, the power control circuit 11 controls the output transistor Mout to turn it off (abnormal operation: output transistor overheat). The overheat detection circuit 12 and the temperature sensor may be a known circuit and sensor.

Figure 2:
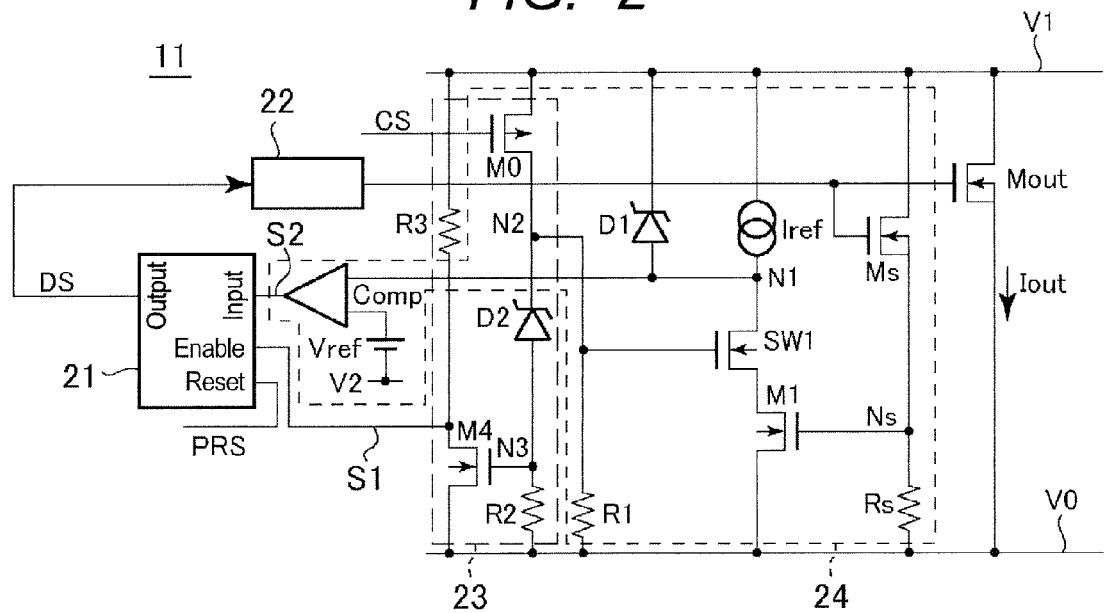
FIG. 2 is a circuit diagram showing the configuration of a power control circuit according to first and third embodiments.

The power control circuit 11 will be described in further detail. FIG. 2 is a circuit diagram showing the configuration of the power control circuit 11 of the semiconductor device 3 according to the first embodiment. The power control circuit includes the output transistor Mout, a first overcurrent detection unit 23, a second overcurrent detection unit 24, a latch circuit 21, and a drive circuit 22.

The output transistor Mout is coupled between the first terminal T1 and the second terminal T0 and controls the current between both terminals. Thus, the power supply from the power source 4 to the load 5 is controlled. The output transistor Mout is, for example, a metal oxide semiconductor (MOS) transistor. In this diagram, an n-channel type MOS (NMOS) is used. Examples of an MOS transistor include diffused MOS (DMOS) transistors, lateral diffused MOS (LDMOS) transistors, and vertical MOS transistors. The output transistor Mout may include multiple output transistors Mout. The first terminal T1 is coupled to the power source 4 and therefore may be regarded as a first power source V1 (potential V1).

The first overcurrent detection unit 23 detects whether the drain-source voltage VDS of the output transistor Mout is greater than or equal to a first reference value and outputs a first detection signal S1 indicating the detection result. The first reference value may be, for example, a criterion value VQ of the drain-source voltage VDS of the output transistor Mout from which the load 5 can be determined to be heavily short-circuited (heavily short-circuit state), or a value corresponding to the value VQ. A desired value can be set to the value VQ in accordance with the design. As seen above, in the present embodiment, the criterion for a determination (first reference value) is not an output current Iout which passes through the output transistor Mout (or a current corresponding to the output current Iout), but the drain-source voltage VDS of the output transistor Mout. The first reference value VQ can be regarded as a voltage threshold for detecting a heavily short-circuit state.

When the drain-source voltage VDS of the output transistor Mout is greater than or equal to the first reference value VQ (the result is "true"), the first overcurrent detection unit 23 may output a signal indicating "active" as the first detection signal S1. In contrast, when the drain-source voltage VDS of the output transistor Mout is smaller than the first reference value VQ (the result is "false"), the first overcurrent detection unit 23 may output a signal indicating "inactive" as the first detection signal S1. "Active" and "inactive" may be reversed. Alternatively, when the drain-source voltage VDS of the output transistor Mout is greater than or equal to the first reference value VQ (the result is "true"), the first overcurrent detection unit 23 may output the first detection signal S1; when the drain-source voltage VDS of the output transistor Mout is smaller than the first reference value VQ (the result is "false"), the first overcurrent detection unit 23 may avoid from outputting the first detection signal S1. The same applies to other signals.

The second overcurrent detection unit 24 detects whether the output current Iout passing through the output transistor Mout is greater than or equal to a second reference value and outputs a second detection signal S2 indicating the detection result. As used herein, the second reference value refers to a value for determining that the load 5 is not heavily short-circuited but the resistance value thereof falls below a criterion resistance value (partially load short-circuit state), as well as a threshold for limiting the output current Iout (current limit threshold Ith). At this time, VQ2<VQ where the value VQ2 represents the drain-source voltage VDS of the output transistor Mout when the output current Iout is the second reference value. Note that VQ2 is greater than the drain-source voltage VDS of the output transistor Mout during normal operation.

The second reference value is also used as a threshold for interrupting the output current Iout (overcurrent interrupt threshold) when the load 5 is heavily short-circuited. That is, the second reference value is a threshold for limiting the current, as well as a threshold for interrupting an overcurrent. In other words, the threshold for limiting the current and the threshold for interrupting an overcurrent are the same value.

When the latch circuit 21 receives a first detection signal S1 indicating that the drain-source voltage VDS of the output transistor Mout is greater than or equal to the first reference value VQ, it latches the value of the second detection signal S2. The latch circuit 21 then outputs the latched value as an overcurrent detection signal DS to the drive circuit 22. When the drain-source voltage VDS of the output transistor Mout receives a first reference value indicating that the drain-source voltage VDS of the output transistor Mout is smaller than the first reference value, it substantially interrupts a latch operation by itself and outputs the second detection signal S2 as an overcurrent detection signal DS to the drive circuit 22 without latching the second detection signal S2. In other words, the first detection signal S1 can be regarded as an enable signal for the latch circuit 21. That is, when the first detection signal S1 is active (or output), the latch circuit 21 is enabled. In contrast, when the first detection signal S1 is inactive (or not output), the latch circuit 21 is not enabled and thus does not latch the input signal. The overcurrent detection signal DS can be regarded as a signal indicating whether an overcurrent is passing through the output transistor Mout.

The drive circuit 22 controls the output transistor Mout to turn it off when the drive circuit 22 receives the overcurrent detection signal DS, which is active or indicating an overcurrent state. This is intended to interrupt the overcurrent of the output transistor Mout. In contrast, when the drive circuit 22 receives the overcurrent detection signal DS which is inactive or indicating a non-overcurrent state, the drive circuit 22 controls the output transistor Mout to turn it on. This is because no overcurrent is passing through the output transistor Mout. Thus, the current is provided to the load 5.

When the drain-source voltage VDS of the output transistor Mout is greater than or equal to the first reference value VQ, the value (active or indicating an overcurrent state) of the second detection signal S2 is latched by the latch circuit 21 and then output as the overcurrent detection signal DS. The value of the second detection signal S2 is continuously latched until the latch circuit 21 is reset. Thus, the drive circuit 22 controls the output transistor Mout to keep it off. As a result, the overcurrent is interrupted, allowing the device or the like to be protected (overcurrent interrupt function). In other words, in the present embodiment, it is detected that the drain-source voltage VDS of the output transistor Mout is greater than or equal to the first reference value VQ and at the same time the output current Iout is greater than or equal to the second reference value. Thus, the output transistor Mout can be interrupted and latched.

In contrast, when the drain-source voltage VDS of the output transistor Mout is smaller than the first reference value VQ, input to the latch circuit 21 is prohibited, and the second detection signal S2 is output without change as the overcurrent detection signal DS. Thus, when the second detection signal S2 is active or indicating an overcurrent state, the drive circuit 22 controls the output transistor Mout to turn it off; when the second detection signal S2 is inactive or indicating a non-overcurrent state, the drive circuit 22 controls the output transistor Mout to turn it on. If the load 5 continues to be partially short-circuited, the following (1) and (2) are repeated. (1) When the value of the second detection signal S2 becomes active or indicates an overcurrent state, the output transistor Mout is controlled to be turned off. As a result, the output current Iout is reduced, making the value of the second detection signal S2 inactive. (2) When the value of the second detection signal S2 becomes inactive or indicates a non-overcurrent state, the output transistor Mout is controlled to be turned on. As a result, the output current Iout is increased, making the value of the second detection signal S2 active. Thus, the drive circuit 22 controls the output transistor Mout to alternately turn it on and off, on the basis of the overcurrent detection signal DS (substantially, the second detection signal S2) from the latch circuit 21. As a result, the overcurrent is limited, allowing the device or the like to be protected from the overcurrent (current limit function). In other words, in the present embodiment, by detecting that the drain-source voltage VDS of the output transistor Mout is smaller than the first reference value VQ and at the same time the output current Iout is greater than or equal to the second reference value, it is possible to limit the output current Iout using the second reference value.

Next, an example of the circuit configuration of the second overcurrent detection unit 24 will be described.

The second overcurrent detection unit 24 includes a sense transistor Ms, a sense resistor Rs, a current source Iref (for example, constant current source), a transistor M1, and a comparator Comp. The sense transistor Ms is coupled in parallel to the output transistor Mout with respect to the first terminal T1 (first power source V1). The respective gates of the output transistor Mout and the sense transistor Ms are coupled together. The sense transistor Ms is, for example, a transistor which is the same as the output transistor Mout in sectional structure but is different therefrom in size (channel width W). In this diagram, an NMOS transistor is used as the sense transistor Ms. The sense resistor Rs is coupled between the sense transistor Ms and the source voltage reference (in this diagram, the second terminal T0). In other words, the sense transistor Ms and the sense resistor Rs are coupled together in series, as well as coupled between the drain and source of the output transistor Mout.

The sense transistor Ms reflects the state of the output transistor Mout. Ideally, the voltage across the sense resistor Rs is proportional to the current of the output transistor Mout. That is, the sense transistor Ms senses the state of the output transistor Mout, and the voltage across the sense resistor Rs is generated based on the current of the output transistor Mout.

The current source Iref (for example, constant current) is coupled in parallel to the sense transistor Ms and the output transistor Mout with respect to the first terminal T1 (first power source V1). The transistor M1 is coupled between the current source Iref and the source voltage reference (in this diagram, the second terminal T0) via a switch transistor SW1. The gate of the transistor M1 is coupled to a node Ns between the sense transistor Ms and the sense resistor Rs. The transistor M1 and the switch transistor SW1 are, for example, NMOS transistors. In other words, the current source Iref, the switch transistor SW1, and the transistor M1 are coupled together in series, as well as coupled between the drain and source of the output transistor Mout.

The switch transistor SW1 is turned on or off when the power control circuit 11 is activated or deactivated. This prevents power from being consumed uselessly when the power control circuit 11 is deactivated. The current source Iref provides the current ref for determining the second reference value, to a node N1, which is a node between the current source Iref and the transistor M1 via the switch transistor SW1. On the other hand, the transistor M1 monitors the voltage across the sense resistor Rs (the voltage of the node Ns). An increase in the voltage across the sense resistor Rs causes an increase in the gate-source voltage of the transistor M1. Thus, the transistor M1 is turned on, so that the resistance value thereof becomes a value corresponding to the voltage across the sense resistor Rs. That is, the transistor M1 can be regarded as a variable resistor whose resistance value varies according to the voltage of the node Ns. An increase in the voltage of the node Ns causes a reduction in the resistance value of the transistor M1. Accordingly, when the voltage of the node Ns becomes a given voltage, the voltage of the node N1 decreases.

The comparator Comp includes one input terminal coupled to the node N1 between the current source Iref and the transistor M1, the other input terminal coupled to a reference voltage source Vref (for example, constant voltage), and an output terminal coupled to an input terminal of the latch circuit 21. The reference voltage source Vref is coupled to a second power source V2. The comparator Comp compares the potential of the node N1 with the reference voltage Vref and outputs the comparison result as the second detection signal S2 to the latch circuit 21.

When the current of the transistor M1 exceeds the second reference value, the comparator Comp inverts the output thereof. That is, the comparator Comp outputs the second detection signal S2 (active). As a result, the second detection signal S2 is provided to the latch circuit 21. Specifically, an increase in the current of the sense transistor Ms turns on the transistor M1. Subsequently, a further increase in the sense transistor Ms causes the voltage across the sense resistor Rs to exceed a given value (the current of the transistor M1 exceeds the second reference value). Thus, the comparator Comp inverts the output thereof. That is, the comparator Comp outputs the second detection signal S2 (active).

The second overcurrent detection unit 24 also includes a transistor M0, a resistor R1, and a diode D1. The transistor M0 and the resistor R1 are coupled together in series via a node N2, as well as coupled between the drain and source of the output transistor Mout. When the power control circuit 11 is activated, the transistor M0 (for example, PMOS transistor) receives a control signal CS (for example, low level) at the gate thereof and thus is turned on. This changes the potential of the node N2 to the potential V1 (for example, high level) of the first power source V1, turning on the switch transistor SW1 (for example, NMOS transistor). The diode D1 is a Zener diode. The cathode thereof is coupled to the first power source V1, and the anode thereof to the node N1. The diode D1 is added for restricting a voltage between the first power source V1 and the node N1 being not too large, however, the diode D1 may be omitted.

Next, an example of the circuit configuration of the overcurrent detection unit 23 will be described.

The first overcurrent detection unit 23 includes a diode D2, a resistor R2, a resistor R3, a transistor M4, and the transistor M0. The diode D2 is a Zener diode. The cathode thereof is coupled to the first terminal T1 (first power source V1) via the transistor M0. The transistor M0 is, for example, a PMOS transistor. The resistor R2 is coupled between the anode of the diode D2 and the second terminal T0. The resistor R3 is coupled to the first terminal T1 (first power source V1) at one end thereof. The transistor M4 is coupled between the other end of the resistor R3 and the second terminal T0. The gate thereof is coupled to a node N3 between the diode D2 and the resistor R2. The transistor M4 is, for example, an NMOS transistor and is turned on or off according to the potential of the node N3. The drain of the transistor M4 is coupled to an enable terminal of the latch circuit 21. That is, the drain potential of the transistor M4 becomes the first detection signal S1 (enable signal).

When the semiconductor device 3 (IPD) is not operating, a high-level signal is output as a control signal CS, the transistor M0 is turned off, and the dark current is cut. When the semiconductor device 3 (IPD) is operating, a low-level signal is output as a control signal CS, and the transistor M0 is turned on.

In the initial stage of the operation of the power control circuit 11, first, the transistor M0 is turned on. At this time, almost no output current Iout is passing through the output transistor Mout. For this reason, the drain-source voltage VDS of the output transistor Mout is increased regardless of the state of the load 5. Accordingly, the drain-source voltage VDS of the output transistor Mout exceeds the first reference value VQ. As a result, the transistor M4 is turned on, so that the drain voltage level thereof is changed from a high level to a low level. This drain voltage is provided to the enable terminal of the latch circuit 21 as an active first detection signal S1.

Subsequently, if the load 5 is placed in a heavily short-circuit state, this state is maintained. In contrast, if the load 5 is placed in a partially short-circuit state or normal state, an increase in output current causes the drain-source voltage VDS of the output transistor Mout to fall below the first reference value VQ. As a result, the transistor M4 is turned off, so that the drain voltage level thereof is changed from a low level to a high level. This drain voltage is provided to the enable terminal of the latch circuit 21 as an inactive first detection signal S1.

Next, the configurations of the power sources and the relationship thereamong will be described.

Figure 3A:
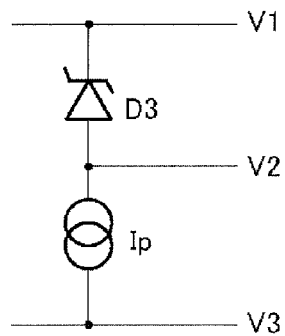
FIG. 3A is a circuit diagram showing the relationship among power sources according to the first embodiment.
Figure 3B:
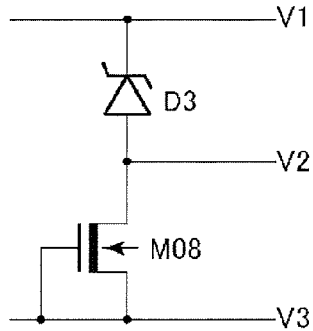
FIG. 3B is a circuit diagram showing the relationship among power sources according to the first embodiment.

FIGS. 3A and 3B are circuit diagrams showing the relationship among the power sources according to the present embodiment. Referring to FIG. 3A, the first power source V1 may be the external power source, power source 4, as described above (FIG. 1). A third power source V3 may be, for example, a ground potential GND. The second power source V2 may be a midpoint potential between a Zener diode D3 and a current source Ip (for example, constant current) coupled in series between the first power source V1 and the third power source V3, and a current source Ip. Referring to FIG. 3B, the current source Ip of FIG. 3A may be a gate-source (GS)-short, depression transistor. In this diagram, the current source Ip is an NMOS transistor M08 having a gate and source coupled to the third power source V3 and a drain coupled to the anode of the Zener diode D3. A resistor may be used in place of the NMOS transistor M08.

Next, an example circuit configuration of the latch circuit 21 will be described.

Figure 4:
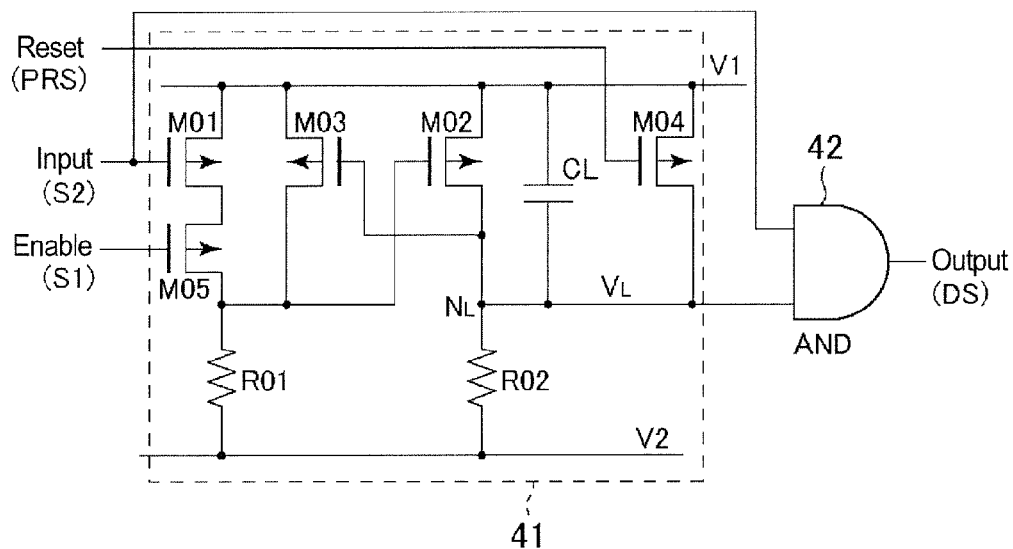
FIG. 4 is a circuit diagram showing a specific example of a latch circuit according to the first embodiment.

FIG. 4 is a circuit diagram showing a specific example of the latch circuit 21 according to the present embodiment. The latch circuit 21 includes a latch unit 41 and an AND circuit 42. The latch unit 41 is enabled by the first detection signal S1, so that the latch unit 41 latches the second detection signal S2. The AND circuit 42 outputs an AND of an output (latched value) of the latch unit 41 and the second detection signal S2.

The latch unit 41 includes transistors M01 to M05, resistors R01 and R02, and a capacitor CL. The transistors M01 to M05 are, for example, PMOS transistors. The transistors M01 and M05 and the resistor R01 are coupled in series in this order between the first power source V1 and the second power source V2. The gate of the transistor M01 receives the second detection signal S2 as an input signal to the latch circuit 21. The gate of the transistor M05 receives the first detection signal S1 as an enable signal to the latch circuit 21. The transistor M03 includes a source coupled to the first power source V1 and a drain coupled to the resistor R01. The transistor M02 and the resistor R02 are coupled in series in this order between the first power source V1 and the second power source V2. The gate of the transistor M03 is coupled to a node $N_L$ for latch, which is a node between the transistor M02 and the resistor R02. That is, a voltage $V_L$ of the node $N_L$ represents the latched value. The gate of the transistor M02 is coupled to a node between the transistor M03 and the resistor R01. The capacitor CL is coupled between the first power source V1 and the node $N_L$. The transistor M04 is coupled between the first power source V1 and the node $N_L$, and the gate thereof receives a reset signal PRS from the microcomputer 2.

At the timing when the semiconductor device 3 (IPD) starts operating on the basis of control signals CS and MCS (for example, on) from the microcomputer 2, a reset signal PRS (for example, low level) is generated inside the IPD and provided to the reset terminal of the latch circuit 21 for a short time. Thus, the latch circuit 21 is reset. This is intended to prevent the latch circuit 21 from malfunctioning in the initial state. The input signal (second detection signal S2) and enable signal (first detection signal S1) to the latch circuit 21 form an exclusive OR (NOR). Only when both signals are low-level signals, the transistor M02 is turned off, reducing the voltage $V_L$ of the node $N_L$ for latch to a low level. At this timing, the transistor M03, whose gate receives the voltage $V_L$, is turned on, increasing the gate of the transistor M02. Thus, the potential $V_L$ of the node $N_L$ is fixed to a low level. Such a latch state is discharged at the following timing: the control signals CS and MCS from the microcomputer 2 are changed from off to on; a reset signal PRS is generated again; and the transistor M04 is turned on.

The AND circuit 42 outputs an AND of the potential $V_L$ of node $N_L$ for latch and the input (second detection signal S2) to the latch circuit 21 as the overcurrent detection signal DS to the drive circuit 22. Specifically, when one of both signals is a low-level signal, the AND circuit 42 outputs a low-level signal as the overcurrent detection signal DS. In contrast, when both signals are high-level signals, it outputs a high-level signal as the overcurrent detection signal DS.

Accordingly, when the potential $V_L$ of the node $N_L$ is fixed to a low level (latched at a low level), a low-level signal is output in a fixed manner as the overcurrent detection signal DS. As a result, the drive circuit 22 turns off the gate of the output transistor Mout on the basis of the overcurrent detection signal DS. At this time, the low-level signal (overcurrent detection signal DS) is latched. For this reason, even when the turn-off of the output transistor Mout reduces the current of the sense transistor Ms and thus reduces the voltage across the sense resistor Rs, the low-level signal (overcurrent detection signal DS) is retained. As a result, the drive circuit 22 keeps the output transistor Mout off on the basis of the overcurrent detection signal DS. Thus, the output current Iout can be interrupted.

In contrast, when the potential $V_L$ of the node NT is a high level (for example, S1 remains a high level), the drive circuit 22 outputs a low-level or high-level signal corresponding to the low level or high level of the input (second detection signal S2) to the latch circuit 21, as the overcurrent detection signal. As a result, the drive circuit controls the gate of the output transistor Mout to a low level or high level on the basis of the overcurrent detection signal DS (that is, second detection signal S2). Subsequently, the gate voltage alternately becomes a low level and a high level. Thus, the output current Iout can be limited by using a given value as a threshold for current limit.

Next, the operation of the semiconductor device according to the first embodiment will be described. In the first embodiment, there will be described a case in which the load is short-circuited partially or heavily when the semiconductor device 3 starts operating.

Figure 5:
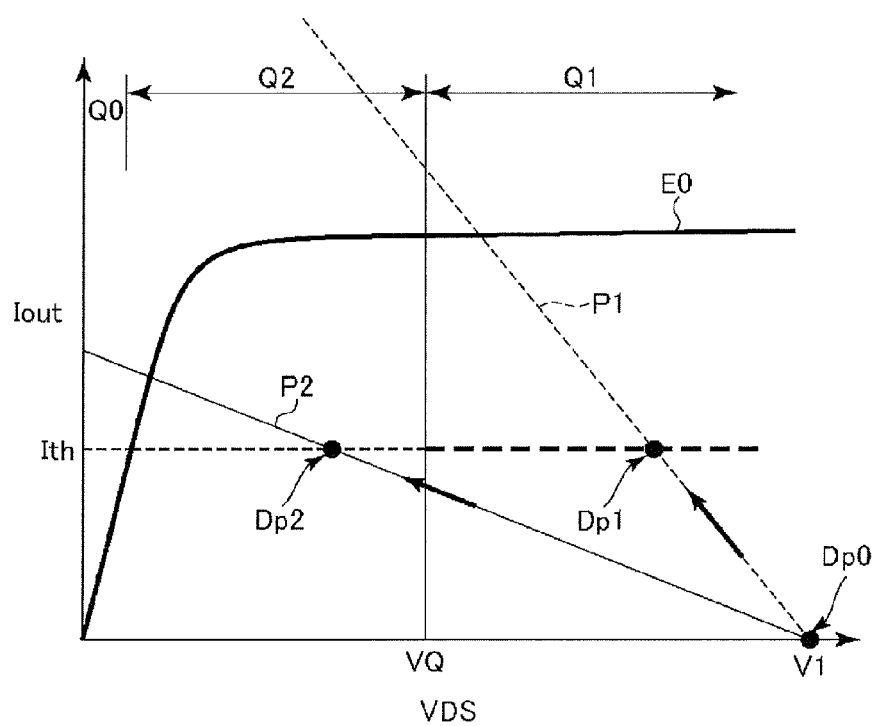
FIG. 5 is a graph showing the operation of the semiconductor device according to the first embodiment.

FIG. 5 is a graph showing the operation of the semiconductor device according to the first embodiment. The vertical axis represents the output current Iout of the output transistor Mout, and the horizontal axis represents the drain-source voltage VDS of the output transistor Mout. A curve 50 represents output transistor characteristics ($I_{DS}$-$V_{DS}$ curve) during normal operation. A broken line, load line P1, represents a load line indicating that the load 5 is placed in a heavily short-circuit state (abnormal state), where the load has a small resistance. A solid line, load line P2, represents a load line indicating that the load 5 is placed in a partially short-circuit state (abnormal state), where the load 5 has a slightly larger resistance than that in a heavily short-circuit state. The area shown by Q0 is an area used during normal operation. The area shown by Q2 is an area used when the load 5 is placed in a partially short-circuit state. At this time, the transistor M4 is in off-state. The area shown by Q1 is an area used when the load 5 is placed in a heavily short-circuit state. At this time, the transistor M4 is turned on. When the drain-source voltage VDS of the output transistor Mout is greater than or equal to the first reference value VQ, the transistor M4 is turned on. For the load lines P1 and P2, when the output current Iout is zero, the drain-source voltage VDS of the output transistor Mout is V1 (operating point Dp0). An overcurrent threshold Ith, that the second reference value is shown by a dotted line (Q2 area) and a broken line (Q1 area).

The overcurrent threshold Ith is designed so as to be a constant value with respect to the drain-source voltage VDS of the output transistor Mout. An input to the latch circuit 21 is permitted in the area Q1, in which the transistor M4 is turned on and in which the drain-source voltage VDS of the output transistor Mout is high. Accordingly, the load line P1 (broken line: heavily short-circuit state) passes through the area Q1, and latching is performed at an operating point Dp1 at which the load line P1 and the overcurrent threshold Ith intersect each other. That is, a value which turns off the output transistor Mout is latched in the latch circuit 21 and then becomes a signal for controlling the gate of the output transistor Mout. Thus, the output current Iout is interrupted. On the other hand, no input to the latch circuit 21 is permitted in the area Q2, in which the transistor M4 is turned off and in which the drain-source voltage VDS of the output transistor Mout is lower than the value VQ. Accordingly, for the load line P2 (solid line: partially short-circuit state), the signal for controlling the gate of the output transistor Mout repeats a high level and a low level near an operating point Dp2 at which the load line P2 and the overcurrent threshold Ith intersect each other. Thus, the current of the output transistor Mout is limited.

Note that the current limit function only limits the current and does not interrupt it. Typically, the overheating detection circuit 12 monitors the temperature of the output transistor Mout using the temperature sensor (not shown) disposed in the output transistor Mout and on-off controls the output transistor Mout via the drive circuit 22 on the basis of the temperature. For example, when the temperature is too high, the overheating detection circuit 12 controls the output transistor Mout to turn it off.

Figure 6:
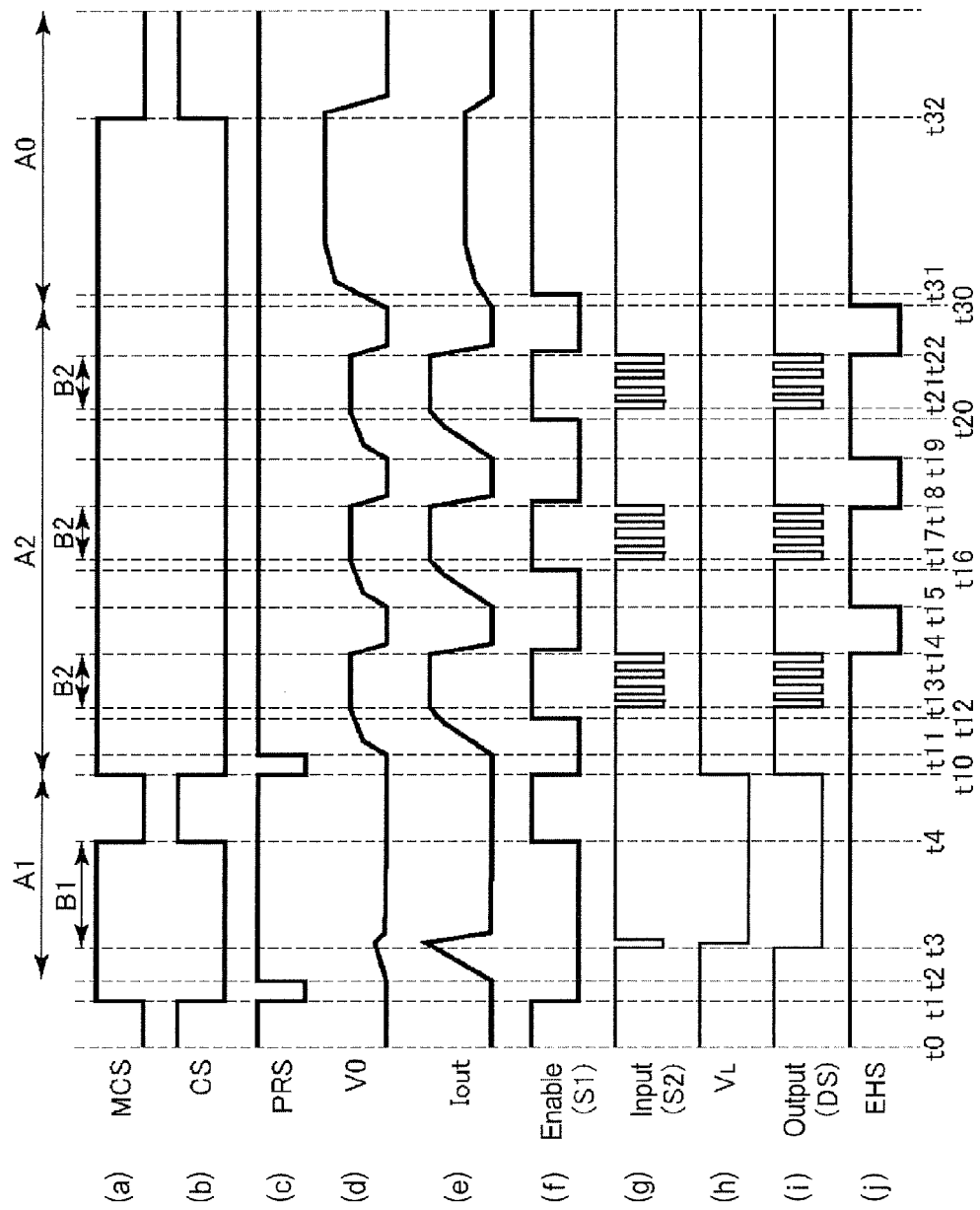
FIG. 6 is a timing chart showing the operation of the semiconductor device according to the first embodiment.

FIG. 6 is a timing chart showing the operation of the semiconductor device according to the first embodiment. In FIG. 6, (a) represents the input signal MCS from the microcomputer 2; (b) represents the control signal CS inside the IPD which is in synchronization with the signal from the microcomputer 2; (c) represents the reset signal PRS generated inside the IPD in accordance with the signal from the microcomputer 2; (d) represents the output voltage V0 of the second terminal T0; (e) represents the output current Iout of the output transistor Mout; (f) represents the enable signal (first detection signal S1) to the latch circuit 21; (g) represents the input signal (second detection signal S2) to the latch circuit 21; (h) represents the potential $V_L$ (latched value) of the node $N_L$ of the latch circuit 21; (i) represents an output signal (overcurrent detection signal DS) of the latch circuit 21; and (j) represents the overheat protection signal EHS output by the overheat detection circuit 12. This chart shows that the load is heavily short-circuited from time t1 to time t10 (period A1). During this period, the current is interrupted from time t3 to time t4 (period E1). The chart also shows that the load is partially short-circuited from time t10 to time t22 (period A2). During this period, the current is limited from time t13 to time t14, from time t17 to time t18, and from time t21 to time t22 (periods B2). The chart also shows that the load is placed in a normal state at time t30 and later (period A0).

First, the operation in the heavily short-circuit state (period A1) will be described. At time t1, the IPD receives the input signal MCS (high level) from the microcomputer 2 and generates the internal signals, the control signal CS (low level) and the reset signal PRS (low-level pulse). In the heavily short-circuit state, the drain-source voltage VDS of the output transistor Mout is increased. This is because the almost all the voltage of the power source 4 is applied to the output transistor Mout. Thus, the diode D2 is broken down, increasing the potential of the node N3, followed by turn-on of the transistor M4. As a result, the drain voltage of the transistor M4 decreases, making the enable signal (first detection signal S1) a low-level signal. That is, the operating point lies on the load line P1 in the area Q1 of FIG. 5.

At time t2, the reset signal PRS becomes inactive (high level). After time t2, the enable signal (first detection signal S1) remains the low level, and the output current Iout of the output transistor Mout increases. On the other hand, the drain-source voltage VDS of the output transistor Mout decreases moderately. That is, the operating point moves upward on the load line P1 in the area Q1 of FIG. 5.

At time t3, the output current Iout of the output transistor Mout reaches a given value (the overcurrent threshold Ith at the operating point Dp1 of FIG. 5). That is, the comparator Comp detects that the potential of the node N1 between the current source Iref and the transistor M1 has fallen below Vref. The input signal (second detection signal S2) to the latch circuit 21 becomes a low-level signal. The output signal (overcurrent detection signal DS) also becomes a low-level signal accordingly. After a short delay, the potential $V_L$ of the node $N_L$ of the latch circuit 21 is also reduced to a low level and then maintained at the low level. The low-level output signal (overcurrent detection signal DS), that is, an off signal is input to the drive circuit 22, turning off the output transistor Mout. As a result, the output current Iout of the output transistor Mout decreases quickly. Thus, the input signal (second detection signal S2) to the latch circuit 21 becomes a high-level signal again. However, as described above, the potential $V_L$ of the node $N_L$ of the latch circuit 21 is maintained at the low level and therefore the output signal (overcurrent detection signal DS) of the latch circuit 21 is also maintained at the low level. This state is maintained until the state is reset by the microcomputer 2 again (that is, from time t4 to time t10).

Next, the operation in a partially short-circuit state (period A2) will be described.

At time t10, the IPD receives the input signal MCS (high level) from the microcomputer 2 and generates the internal signals, the control signal CS (low level) and the reset signal PRS (low-level pulse). In the partially short-circuit state, the drain-source voltage VDS of the output transistor Mout is somewhat low, compared to in the heavily short-circuit state. However, the output current Iout is not passing initially and therefore the drain-source voltage VDS of the output transistor Mout is sufficiently high. Thus, the diode D2 is broken down, increasing the potential of the node N3, followed by a reduction in the drain voltage of the transistor M4. As a result, the enable signal (first detection signal S1) becomes a low-level signal. That is, the operating point lies on the load line P2 in the area Q1 of FIG. 5.

At time t11, the reset signal PRS becomes inactive (high level). From then on, the enable signal (first detection signal S1) remains the low level, and the output current Iout of the output transistor Mout increases. On the other hand, the drain-source voltage VDS of the output transistor Mout decreases quickly. That is, the operating point moves toward upper left on the load line P2 in the area Q1 of FIG. 5.

At time t12, the drain-source voltage VDS of the output transistor Mout becomes VQ, increasing the drain voltage of the transistor M4. Thus, the enable signal (first detection signal S1) becomes a high-level signal. That is, the load line P2 enters the area Q2 in FIG. 5.

At times t13 and t14, the output current Iout of the output transistor Mout reaches a given value (the overcurrent threshold Ith at the operating point Dp2 of FIG. 5). That is, the comparator Comp detects that the potential of the node N1 has fallen below Vref. The input signal (second detection signal S2) to the latch circuit 21 becomes a low-level signal. At this time, the enable signal (first detection signal S1) is a high-level signal, unlike in a heavily short-circuit state. Accordingly, input to the latch circuit 21 is prohibited. For this reason, the potential $V_L$ of the node $N_L$ of the latch circuit 21 remains the initial high level and is not inverted. Accordingly, the latch circuit 21 outputs the low-level input signal (second detection signal S2) as an output signal (overcurrent detection signal DS) without change. The low-level overcurrent detection signal DS, that is, an off signal is input to the drive circuit 22, turning off the output transistor Mout. Thus, the output current Iout of the output transistor Mout decreases and falls below a given value (the overcurrent threshold Ith in FIG. 5). That is, the comparator Comp detects that the potential of the node N1 has become greater than or equal to Vref. Accordingly, the input signal (second detection signal S2) to the latch circuit 21 becomes a high-level signal again. For this reason, the latch circuit 21 outputs the high-level input signal (second detection signal S2) as an output signal (overcurrent detection signal DS) without change. The high-level overcurrent detection signal DS, that is, an on signal is input to the drive circuit 22, turning on the output transistor Mout. Repetition of such operations allows the output current Iout of the output transistor Mout to be confined to near the given value (the overcurrent threshold Ith in FIG. 5).

When, during such an on/off control repetition period, the temperature of the output transistor Mout, which is being monitored using the temperature sensor (not shown) disposed in the output transistor Mout, reaches a given value (for example, at time t14), the overheating detection circuit 12 outputs the overheat protection signal EHS to the drive circuit 22 so as to control the output transistor Mout to turn it off. The control of the output transistor Mout using the overheat protection signal EHS via the drive circuit 22 is independent of the control of the output transistor Mout using the overcurrent detection signal DS via the drive circuit 22.

Operations at times t15 to t18 and t19 to t22 are similar to the operations at times t11 to t14. In FIG. 6, the waveforms of the input signal (second detection signal S2) and the output signal (overcurrent detection signal DS) are sparsely drawn so as to be easy to see. Actually, on/off control is performed on these signals more densely, that is, more frequently.

Next, the operation in a normal load state (period A0) will be described.

In a normal Load state, the drain-source voltage VDS of the output transistor Mout is very low (the voltage V0 of the output terminal is raised to approximately the same as that of the first power source V1). Thus, the enable signal (first detection signal S1) becomes a high-level signal. When the load is normal, the output current Iout of the output transistor Mout does not reach the given value (overcurrent threshold Ith in FIG. 5) and therefore the current limit function does not work. Further, since heating is not significant, the overheat detection circuit 12 does not operate.

The semiconductor device according to the first embodiment operates as described above.

Now, an example circuit configuration of a current source Ierf will be described.

Figure 7A:
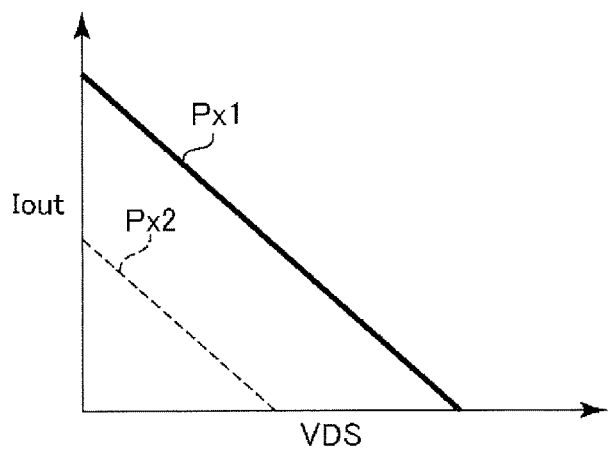
FIG. 7A is an explanatory diagram relating to a current source according to the first embodiment.
Figure 7B:
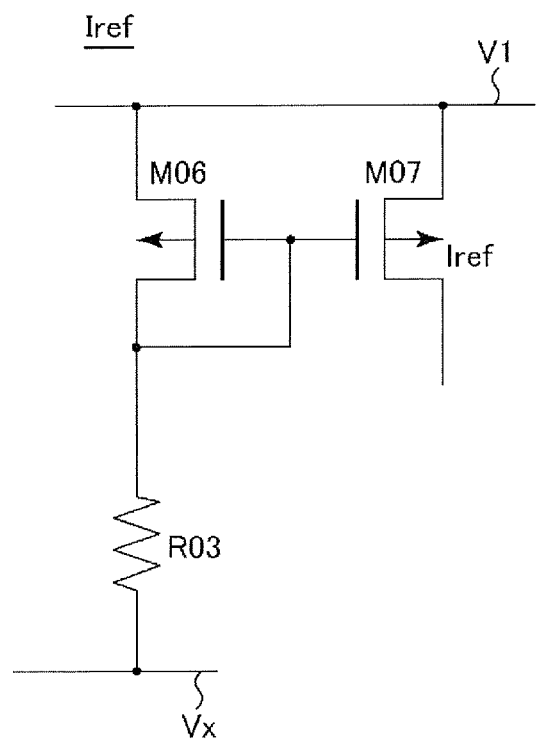
FIG. 7B is an explanatory diagram relating to the current source according to the first embodiment.

FIGS. 7A and 7B are explanatory diagrams relating to the current source Ierf according to the present embodiment. FIG. 7A shows an example of the power supply voltage dependence of the load line in the output transistor Mout. The vertical axis represents the output current Iout, and the horizontal axis represents the drain-source voltage VDS. When the semiconductor device 3 is used actually, the power supply voltage may vary. Thus, by considering that the load is a constant resistance, the current increases or decreases in proportion to the power supply voltage according to Ohm's law. As a result, as shown in FIG. 7A, the load line moves in parallel according to the power supply voltage. For example, when the power supply voltage of a load line Px1 is changed from VDD to VDD/2, the load line Px1 moves in parallel and becomes Px2.

For example, if the current source Iref of FIG. 2 is a current with respect to the power supply voltage (for example, first power source V1), the overcurrent threshold Ith must be set to a high value, considering the movement of the load line based on the power supply voltage shown in FIG. 7A. However, doing so increases the overcurrent threshold, increasing power loss. For this reason, the current source Iref is allowed to depend on the power supply voltage. FIG. 7B shows an example of such a current source Iref. The current source Iref is a current mirror circuit coupled to the power supply voltage (first power source V1). The respective sources of PMOS transistors M06 and M07 are coupled to the power supply voltage (first power source V1). The respective gates thereof are coupled to each other, as well as coupled to the drain of the PMOS transistor M06. The drain of the PMOS transistor M06 is coupled to a reference power source Vx via a resistor R03. The reference power source Vx is, for example, a GND potential. Such a configuration allows a current source Iref proportional to the power supply voltage (first power source V1) to be output. By allowing the current source Iref to depend on the power supply voltage, it is possible to protect against overcurrent more properly. Since an increase in the current source Iref causes an increase in overcurrent threshold, it is possible to achieve an overcurrent threshold in which the power supply voltage dependence of the load line shown in FIG. 7A is considered.

As seen above, in the present embodiment, unlike in Japanese Unexamined Patent Application Publication No. 2001-160747, the drain-source voltage VDS of the output transistor Mout, in place of a timer, is used to switch between current limit and overcurrent interrupt. Thus, a low overcurrent threshold Ith can be set so that power loss in a heavily short-circuit state can be reduced. Further, since the current limit function is performed without using a timer, the current can be limited to a given current value even in an overload state immediately before reaching the overcurrent threshold Ith. As a result, excessive power loss can be prevented.

Second Embodiment

Next, the configuration of a semiconductor device according to a second embodiment will be described. The present embodiment differs from the first embodiment in that the set value of the overcurrent threshold varies between a partially short-circuit state and a heavily short-circuit state. Hereafter, the difference will be mainly described.

A power control circuit 11a according to the present embodiment will be described.

Figure 8:
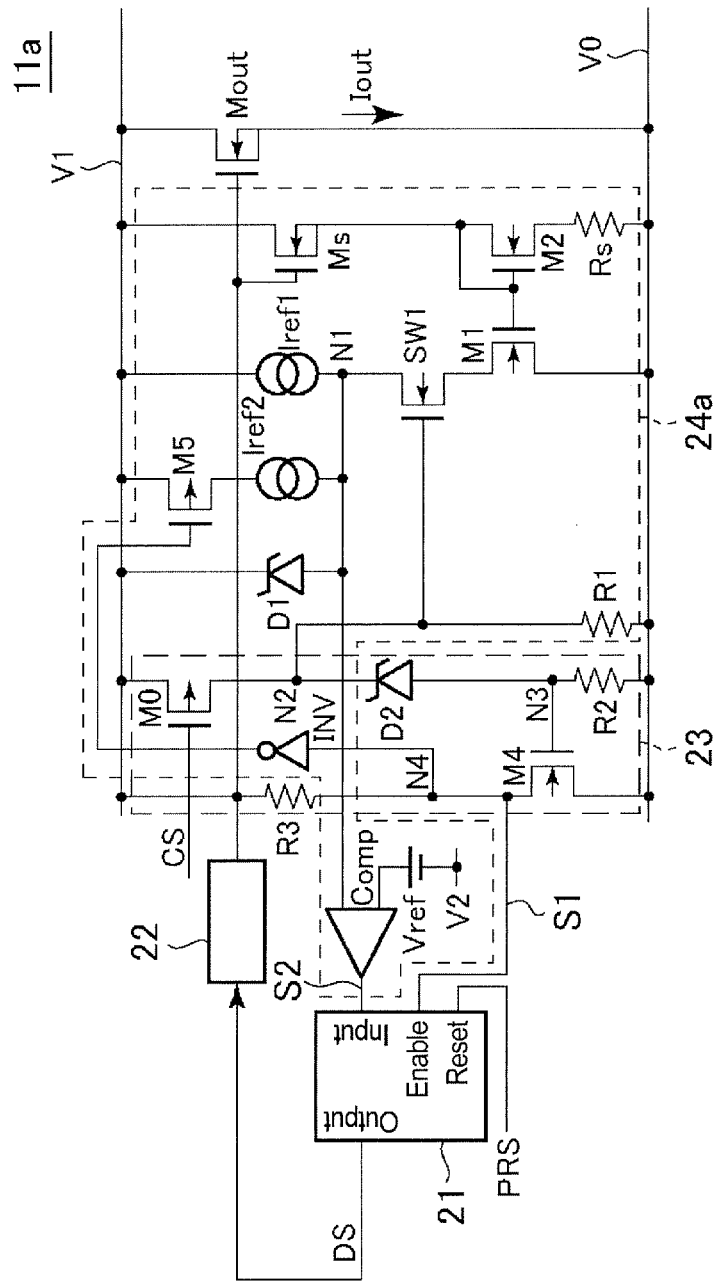
FIG. 8 is a circuit diagram showing the configuration of a power control circuit according to a second embodiment.

FIG. 8 is a circuit diagram showing the configuration of a power control circuit 11a of the semiconductor device 3 according to the second embodiment. The power control circuit 11a includes the output transistor Mout, the first overcurrent detection unit 23, a second overcurrent detection unit 24a, the latch circuit 21, and the drive circuit 22.

While the single second reference value Ith is used in the first embodiment, two second reference values, a high-voltage second reference value Ith1 and a low-voltage second reference value Ith2, are used in the present embodiment. The high-voltage second reference value Ith1 refers to a first second reference value when the drain-source voltage VDS of the output transistor Mout is greater than the first reference value VQ. The low-voltage second reference value Ith2 refers to a second reference value when the drain-source voltage VDS of the output transistor Mout is smaller than the first reference value VQ. Note that the low-voltage second reference value Ith2 is greater than the high-voltage second reference value Ith1.

The low-voltage second reference value Ith2 is also a value for determining that the load 5 is placed in a partially short-circuit state, as well as a threshold for limiting the output current Iout. In this case, VQ2<VQ where VQ2 represents the drain-source voltage VDS of the output transistor Mout when the output current Iout is the low-voltage second reference value Ith2. Note that VQ2 is greater than the drain-source voltage VDS of the output transistor Mout during normal operation. On the other hand, the high-voltage second reference value Ith1 is a value for determining that the load 5 is placed in a heavily short-circuit state, as well as a threshold for interrupting the output current Iout. As described above, the high-voltage second reference value Ith1 is set to a value smaller than the low-voltage second reference value Ith2. Thus, power loss in a heavily short-circuit state can be reduced. Details will be described later. As in the first embodiment, the first reference value VQ is used to determine whether the load 5 is placed in a heavily short-circuit state.

When the load 5 is placed in a partially short-circuit state (when the drain-source voltage VDS of the output transistor Mout is smaller than the first reference value VQ), the second overcurrent detection unit 24a detects whether the output current Iout which is passing through the output transistor Mout is greater than or equal to the low-voltage second reference value Ith2 and outputs a second detection signal S2 indicating the detection result. On the other hand, when the load 5 is placed in a heavily short-circuit state (when the drain-source voltage VDS of the output transistor Mout is greater than the first reference value VQ), the second overcurrent detection unit 24a detects whether the output current Iout which is passing through the output transistor Mout is greater than or equal to the high-voltage second reference value Ith1 and outputs a second detection signal S2 indicating the detection result.

As seen above, in the present embodiment, the threshold Ith2 for current limit and the threshold Ith1 for overcurrent interrupt are different values (Ith2>Ith1). That is, in the interruption of the current, a relatively low current is interrupted early. Thus, a power loss can be reduced. In the limitation of the current, on the other hand, a relatively high current is limited. Thus, a load through which the current easily passes can be prevented from being subjected to unnecessary current limit.

The second overcurrent detection unit 24a includes the sense transistor Ms, a transistor M2, the sense resistor Rs, a first current source Iref1 (for example, constant current), a switch transistor M5, a second current source Iref2 (for example, constant current), the transistor M1, and the comparator Comp. The sense transistor Ms is coupled in parallel to the output transistor Mout with respect to the first terminal T1. The respective gates of the output transistor Mout and the sense transistor Ms are coupled together. The transistor M2 is coupled to the sense transistor Ms in series. The gate of the transistor M2 is coupled to a node between the transistor M2 and the sense transistor Ms. The sense transistor Ms and the output transistor Mout are, for example, MOS transistors having the same sectional structure. In this diagram, the transistor M2 is an NMOS transistor. The sense resistor Rs is coupled between the transistor M2 and the second terminal T0. In other words, the sense transistor Ms, the transistor M2, and the sense resistor Rs are coupled together in series, as well as coupled between the drain and source of the output transistor Mout.

The sense transistor Ms reflects the state of the output transistor Mout. Ideally, the voltage across the sense resistor Rs is proportional to the current of the output transistor Mout. Specifically, the sense transistor Ms senses the state of the output transistor Mout, and the voltage across the sense resistor Rs is generated based on the current of the output transistor Mout. The transistor M2 will be described later.

The first current source Iref1 is coupled in parallel to the sense transistor Ms with respect to the first terminal T1. The switch transistor M5 is coupled in parallel to the sense transistor Ms with respect to the first terminal T1. The gate thereof is coupled to the drain of the transistor M4 of the first overcurrent detection unit 23 via an inverter INV. The switch transistor M5 is turned on when the first detection signal S1 is inactive (the drain potential of the transistor M4 is in higher level). That is, the switch transistor M5 is turned on according to an inverted first detection signal S1. The transistor M5 is, for example, a PMOS transistor. The second current source Iref2 is coupled to the switch transistor M5 in series. In other words, the first current source 1 is coupled between the first terminal T1 and the node N1, and the switch transistor M5 and the second current source Iref2 are coupled in series between the first terminal T1 and the node N1.

The transistor M1 is coupled between the node N1 and the source of the output transistor Mout (in this diagram, second terminal T0) via the switch transistor SW1. The gate of the transistor M1 is coupled to a node between the sense transistor Ms and the transistor M2, as well as coupled to the gate of the transistor M2. The transistors M1 and M2 and the switch transistor SW1 are, for example, NMOS transistors. In other words, the first current source Iref1, the switch transistor SW1, and the transistor M1 are coupled in series between the drain and source of the output transistor Mout, and the switch transistor M5, the second current source Iref2, the switch transistor SW1, and the transistor M1 are coupled in series between the drain and source of the output transistor Mout, respectively. The reason why the transistor M2 is added to the first embodiment is to cancel out variations in the threshold voltage of the transistor M1. The transistor M2 has the same structure as the transistor M1. If the variations in the threshold voltage are small, the transistor M2 may be omitted.

The first current source Iref1 provides a current Iref1 to the node N1, which the node between the first current source Iref1 and the transistor M1 via the switch transistor SW1. When the load is placed in a partially short-circuit state (when the drain-source voltage VDS of the output transistor Mout is smaller than the first reference value VQ), the switch transistor M5 is in on-state. Accordingly, the second current source Iref2 provides a current Iref2 to the node N1. On the other hand, the transistor M1 monitors the voltage across the sense resistor Rs. An increase in the voltage across the sense resistor Rs causes an increase in the gate voltage of the transistor M1, turning on the transistor M1. Thus, the resistance value of the transistor M1 is changed to a resistance value corresponding to the voltage across the sense resistor Rs. That is, the transistor M1 can be regarded as a variable resistor whose resistance value varies according to the voltage across the sense resistor Rs. As a result, when the voltage across the sense resistor Rs reaches a given value, the potential of the node N1 decreases. In this case, the overcurrent threshold (current limit threshold) serving as the low-voltage second reference value Ith2 is determined based on the sum of Iref1 and Iref2.

On the other hand, when the load is placed in a heavily short-circuit state (when the drain-source voltage VDS of the output transistor Mout is greater than the first reference value VQ), the switch transistor M5 is turned off. Accordingly, the first current source Iref1 provides the current Iref1 to the node N1, while the second current source Iref2 does not provide the current Iref2 to the node N1. An increase in the voltage across the sense resistor Rs causes an increase in the gate voltage of the transistor M1, turning on the transistor M1. Thus, the resistance value of the transistor M1 is changed to a resistance value corresponding to the voltage across the sense resistor Rs. That is, the transistor M1 can be regarded as a variable resistor whose resistance value varies according to the voltage across the sense resistor Rs. As a result, when the voltage across the sense resistor Rs reaches a given value, the potential of the node N1 decreases. In this case, the overcurrent threshold (overcurrent interrupt threshold) serving as the high-voltage second reference value Ith1 is determined based on Iref1.

As seen above, in the present embodiment, the threshold Ith2 for current limit and the threshold Ith1 for overcurrent interrupt are different values (Ith2>Ith1).

Figure 10:
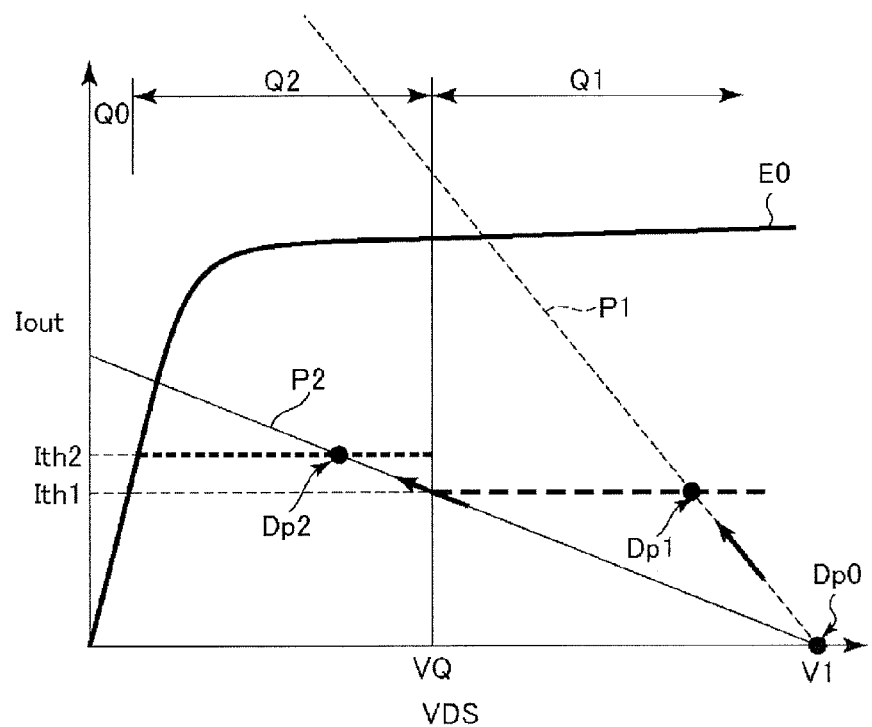
FIG. 10 is a graph showing the operation of a semiconductor device according to the second embodiment.

Next, the operation of the semiconductor device according to the second embodiment will be described. In the second embodiment, there will be described a case in which the load is placed in a partially short-circuit state or a heavily short-circuit state when the semiconductor device 3 starts operating. FIG. 10 is a graph showing the operation of the semiconductor device according to the second embodiment. The graph of FIG. 10 is similar to that of FIG. 5. Of the overcurrent thresholds Ith, the threshold Ith2 for current limit is shown by a dotted line (area Q2), and the threshold Ith1 for overcurrent interrupt is shown by a broken line (area Q1).

The overcurrent thresholds (high-voltage second reference value Ith1, low-voltage second reference value Ith2) are designed so as to be constant values, respectively. Input to the latch circuit 21 is permitted in the area Q1, in which the transistor M4 is turned on and in which the drain-source voltage VDS of the output transistor Mout is high. The load line P1 (broken line: heavily short-circuit state having a small resistance value) passes through the area Q1 and latching is performed at the operating point Dp1 at which the load line P1 and the threshold Ith1 for overcurrent interrupt intersect each other. On the other hand, input to the latch circuit 21 is not permitted in the area Q2, in which the transistor M4 is turned off and in which the drain-source voltage VDS of the output transistor Mout is lower than the value VQ. Accordingly, for the load line P2 (solid line: partially short-circuit state having a slightly large resistance), the signal for controlling the gate of the output transistor alternately becomes a high level and a low level near an operating point Dp2 at which the load line P2 and the threshold Ith2 for current limit intersect each other. Thus, the current of the output transistor Mout is limited.

Referring now to the timing chart of FIG. 6, the operation of the semiconductor device according to the second embodiment will be described. The present embodiment differs from the first embodiment in that in FIG. 6, the respective absolute values of (d) the voltage V0 of the second terminal T0 and (e) output current but vary between the period B1 and period B2 (those in period 52 are greater).

First, the operation in a heavily short-circuit state (period A1) will be described.

At time t1, the IPD receives the input signal MCS (high level) from the microcomputer 2 and generates the internal signals, the control signal CS (low level) and the reset signal PRS (low-level pulse). In the heavily short-circuit state, the drain-source voltage VDS of the output transistor Mout is high. This is because the almost all the voltage of the power source 4 is applied to the output transistor Mout. Thus, the diode D2 is broken down, increasing the potential of the node N3, followed by turn-on of the transistor M4. As a result, the drain voltage of the transistor M4 decreases, making the enable signal (first detection signal S1) a low-level signal. That is, the operating point lies on the load line C1 in the area Q1 of FIG. 10. At time t2, the reset signal PRS becomes inactive (high level). From then on, the enable signal (first detection signal S1) remains the low level, and the output current Iout of the output transistor Mout increases. On the other hand, the drain-source voltage VDS of the output transistor Mout decreases moderately. That is, the operating point moves upward on the load line P1 in the area Q1 of FIG. 10.

At time t3, the output current Iout of the output transistor Mout reaches a given value (high-voltage second reference value Ith1 at the operating point Dp1 in FIG. 10). That is, the comparator Comp detects that the potential of the node N1 between the first current source Iref1 and the transistor M1 has reached Vref. The input signal (second detection signal S2) to the latch circuit 21 becomes a low-level signal. The output signal (overcurrent detection signal DS) also becomes a low-level signal accordingly. After a short delay, the potential $V_L$ of the node $N_L$ of the latch circuit 21 also becomes a low level and is maintained at the low level. The low-level overcurrent detection signal DS, that is, an off signal is input to the drive circuit 22, turning off the output transistor Mout. As a result, the output current Iout of the output transistor Mout decreases quickly. Thus, the input signal (second detection signal S2) of the latch circuit 21 becomes a high-level signal again. However, as described above, the potential $V_L$ of the node $N_L$ of the latch circuit 21 is maintained at the low level and therefore the output signal (overcurrent detection signal DS) of the latch circuit 21 is also maintained at the low level. This state is maintained until the state is reset by the microcomputer 2 again (that is, from time t4 to time t10).

Next, the operation in a partially short-circuit state (period A2) will be described.

At time t10, the IPD receives the input signal MCS (high level) from the microcomputer 2 and generates the internal signals, the control signal CS (low level) and the reset signal PRS (low-level pulse). In the partially short-circuit state, the drain-source voltage VDS of the output transistor Mout is somewhat low, compared to in the heavily short-circuit state. However, the drain-source voltage VDS of the output transistor Mout is initially high enough. Thus, the diode P2 is broken down, increasing the potential of the node N3. As a result, the drain voltage of the transistor M4 decreases, making the enable signal (first detection signal S1) a low-level signal. That is, the operating point lies on the load line P2 in the area Q1 of FIG. 10.

At time t11, the reset signal PRS becomes inactive (high level). From then on, the enable signal (first detection signal S1) remains the low level, and the output current Iout of the output transistor Mout is increased. On the other hand, the drain-source voltage VDS of the output transistor Mout decreases quickly. That is, the operating point moves toward upper left on the load line P2 in the area Q1 of FIG. 10.

At time t12, the drain-source voltage VDS of the output transistor Mout becomes VQ, increasing the drain voltage of the transistor M4. Thus, the enable signal (first detection signal S1) becomes a high-level signal. That is, the operating point enters the area Q2 on the load line P2 of FIG. 10.

At times t13 and t14, the output current Iout of the output transistor Mout reaches a given value (current limit threshold Ith2 at the operating point Dp2 in FIG. 10). That the comparator Comp detects that the potential of the node N1 has fallen below Vref. The input signal (second detection signal S2) to the latch circuit 21 becomes a low-level signal. At this time, the enable signal (first detection signal 51) is a high-level signal, unlike in the heavily short-circuit state. Accordingly, input to the latch circuit 21 is prohibited. For this reason, the potential $V_L$ of the node $N_L$ of the latch circuit 21 remains the initial high level and is not inverted. Accordingly, the latch circuit 21 outputs the low-level input signal (second detection signal S2) as an output signal (overcurrent detection signal DS) without change. The low-level overcurrent detection signal DS, that is, an off signal is input to the drive circuit 22, turning off the output transistor Mout. The output current Iout of the output transistor Mout decreases and falls below a given value (current limit threshold Ith2 in FIG. 10). That is, the comparator Comp detects that the potential of the node N1 has become greater than or equal to Vref. The input signal (second detection signal S2) of the latch circuit 21 becomes a high-level signal again. Accordingly, the latch circuit 21 outputs the high-level input signal (second detection signal S2) as an output signal (overcurrent detection signal DS) without change. The high-level overcurrent detection signal DS, that is, an on signal is input to the drive circuit 22, turning on the output transistor Mout. Repetition of such operations allows the output current Iout the output transistor Mout to be confined to r given value (current limit threshold Ith2 in FIG. 10).

The operation of the overheat detection circuit 12 is similar to that in the first embodiment. The operations at times t15 to t19 and t19 to t22 are similar to those at times t1 to t14 described above. The operation in a normal load state (period A0) is similar to that in the first embodiment.

The semiconductor device according to the second embodiment operates as described above.

The present embodiment can produce effects similar to those of the first embodiment.

In the first embodiment, the threshold for current limit and the threshold for overcurrent interrupt must be set to the same value. Accordingly, these thresholds must be set to a little too high a value, considering the drive capacity of the load. As a result, the overcurrent threshold also tends to be set to a high value. In the second embodiment, on the other hand, the threshold for current limit and the threshold for overcurrent interrupt can be set independently by adjusting the current ratio between the first current source Iref1 and the second current source Iref2. That is, the threshold for current limit can be set to a value higher than the threshold for overcurrent interrupt, and vice versa.

In the present embodiment, the method for setting the threshold for current limit and the threshold for overcurrent interrupt independently is not limited to the example of FIG. 8 and may be performed using other circuit configurations. The configuration of a modification of a power control circuit according to the second embodiment will be described below.

Figure 9:
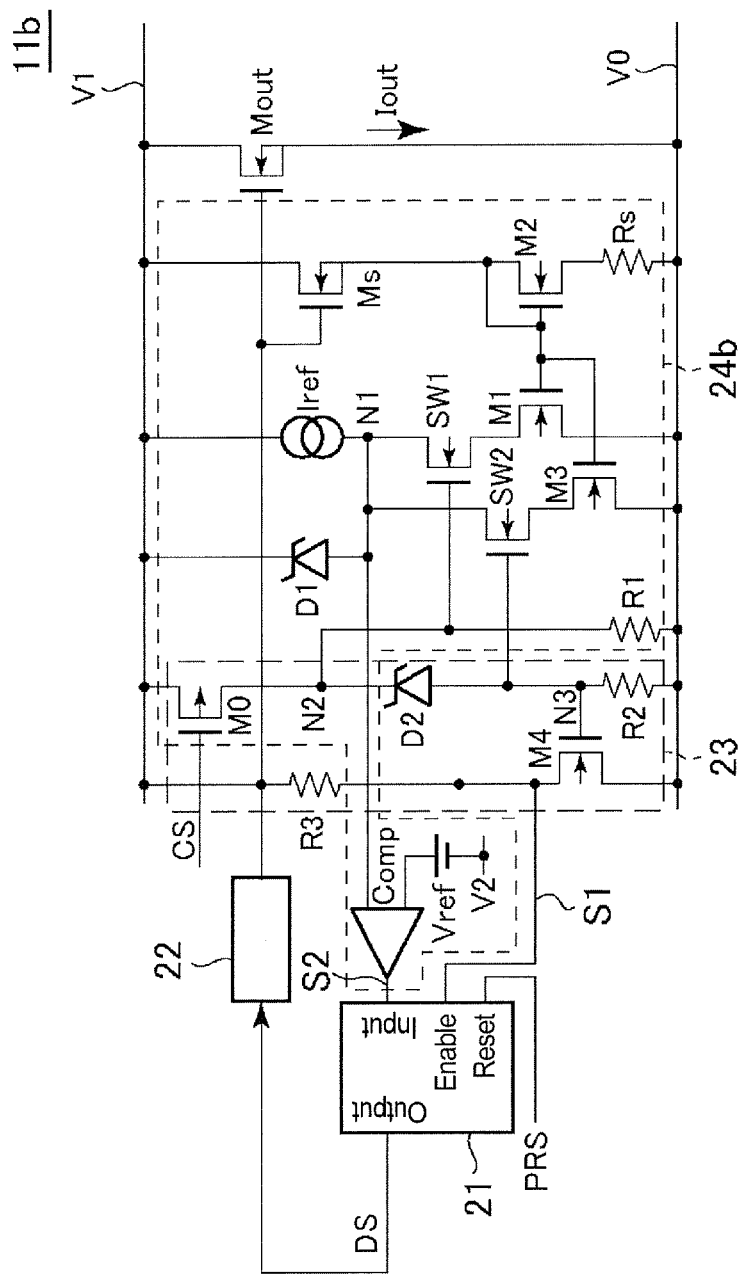
FIG. 9 is a circuit diagram showing the configuration of a modification of the power control circuit according to the second embodiment.

FIG. 9 is a modified circuit diagram showing the configuration of a power control circuit 11b of the semiconductor device 3 according to the second embodiment. The power control circuit 11b includes the output transistor Mout, the first overcurrent detection unit 23, a second overcurrent detection unit 24b, the latch circuit 21, and the drive circuit 22. The method (circuit) for generating the two reference values, the high-voltage second reference value Ith1 and the low-voltage second reference value Ith2, according to the present modification differs from that shown in FIG. 8. The difference between FIGS. 9 and 8 will be mainly described below.

When the load is placed in a partially short-circuit state (when the drain-source voltage VDS of the output transistor Mout is smaller than the first reference value VQ), the second overcurrent detection unit 24b detects whether the output current Iout which is passing through the output transistor Mout is greater than or equal to the low-voltage second reference value Ith2 and outputs a second detection signal S2 indicating the detection result. On the other hand, when the load is placed in a heavily short-circuit state (when the drain-source voltage VDS of the output transistor Mout is to than the first reference value VQ), the second overcurrent detection unit 24b detects whether the output current Iout which is passing through the output transistor Mout is greater than or equal to the high-voltage second reference value Ith1 and outputs a second detection signal S2 indicating the detection result. As seen above, in the present modification, the threshold Ith2 for current limit and the threshold Ith1 for overcurrent interrupt are different values.

The second overcurrent detection unit 24b includes the sense transistor Ms, the transistor M2, the sense resistor Rs, the current source Iref, the switch transistor SW1, the transistor M1, a switch transistor SW2, a transistor M3, and the comparator Comp. The sense transistor Ms is coupled in parallel to the output transistor Mout with respect to the first terminal T1. The respective gates of the sense transistor Ms and the output transistor Mout are coupled together. The transistor M2 is coupled to the sense transistor Ms in series, and the gate thereof is coupled to the node between the transistor M2 and the sense transistor Ms. The sense transistor Ms and the output transistor Mout are, for example, MOS transistors having the same sectional structure. In this diagram, the transistor M2 is an NMOS transistor. The sense resistor Rs is coupled between the transistor M2 and the second terminal T0. In other words, the sense transistor Ms, the transistor M2, and the sense resistor Rs are coupled together in series, as well as coupled between the drain and source of the output transistor Mout.

The current source Iref is coupled in parallel to the sense transistor Ms with respect to the first terminal T1. The transistor M1 is coupled between the node N1 (current source Iref) and the source of the output transistor Mout (in this diagram, second terminal T0) via the switch transistor SW1. The gate of the transistor M1 is coupled to the node between the sense transistor Ms and the transistor M2, as well as coupled to the gate of the transistor M2. The switch transistor SW1 is turned on when the semiconductor device 3 operates. The transistor M3 is coupled between the node N1 (current source Iref) and the source of the output transistor Mout (in this diagram, second terminal T0) via the switch transistor SW2. The gate of the transistor M3 is coupled to the node between the sense transistor Ms and the transistor M2, as well as coupled to the gate of the transistor M2. The gate of the switch transistor SW2 is coupled to the node N3 and is turned on in the same area as the area in which the transistor M4 is turned on (when the drain-source voltage VDS of the output transistor Mout is greater than the first reference value VQ). The transistors M1 and M3 and the switch transistors SW1 and SW2 are, for example, NMOS transistors. In other words, the current source Iref, the switch transistor SW1, and the transistor M1 are coupled together in series between the drain and source of the output transistor Mout, and the current source Iref, the switch transistor SW2, and the transistor M3 are coupled together in series between the drain and source of the output transistor Mout, respectively. If the transistors M1, M2, and M3 are MOS transistors having the same structure, accuracy is increased.

The current source Iref provides a current Iref to the node N1, which is the node between the current source Iref and the transistor M1 via the switch transistor SW1, as well as the node between the current source Iref and the transistor M3 via the switch transistor SW2. However, in the partially short-circuit state (when the drain-source voltage VDS of the output transistor Mout is smaller than the first reference value VQ), the switch transistor SW2 is in off-state. Accordingly, the current does not pass through the transistor M3. On the other hand, the switch transistor SW1 is in on-state. Accordingly, the transistor M1 has a resistance value corresponding to the voltage across the sense resistor Rs. As a result, the difference between a resistance value obtained from the potential difference between the first terminal T1 and the node N1 and from the current Iref and the resistance value of the transistor M1 serves as the potential of the node N1. Thus, the overcurrent threshold (threshold for current limit) serving as the low-voltage second reference value Ith2 is determined.

As described above, the current source Iref typically provides a constant current. Further, in the heavily short-circuit state (when the drain-source voltage VDS of the output transistor Mout is greater than the first reference value VQ), the switch transistor SW2 is turned on. Accordingly, the current passes through the transistor M3 having a resistance value corresponding to the voltage across the sense resistor Rs. Further, the switch transistor SW1 is in on-state. Accordingly, the transistor M1 also has a resistance value corresponding to the voltage across the sense resistor Rs. As a result, the difference between the parallel resistance value the transistors M1 and M3, and a resistance value obtained from the potential difference between the potential V1 of the first terminal T1 and the node N1 and from the current Iref serves as the potential of the node N1. In this case, the overcurrent threshold (threshold for overcurrent interrupt) serving as the high-voltage second reference value Ith1 is Ith2/2 when the transistors M1 and M3 have the same structure.

As seen above, in the present modification, the threshold Ith2 for current limit and the threshold for overcurrent interrupt (Ith1=Ith2/2) are different values (Ith2>Ith1).

FIG. 9 can also produce effects similar to those in FIG. 8.

The functions of the semiconductor device 3 (FIG. 8 or FIG. 9) according to the present embodiment are useful for load applications which involve an inrush current, such as a lamp load. An example where the present embodiment is applied to a lamp load will be described below.

Example

The Example is an example in which the semiconductor device 3 according to the second embodiment is applied to a lamp (lighting fixture). In the case of FIG. 1, the load 5 becomes a lamp (lighting fixture). The lamp is, for example, a halogen lamp used in an automobile or railroad.

Figure 11:
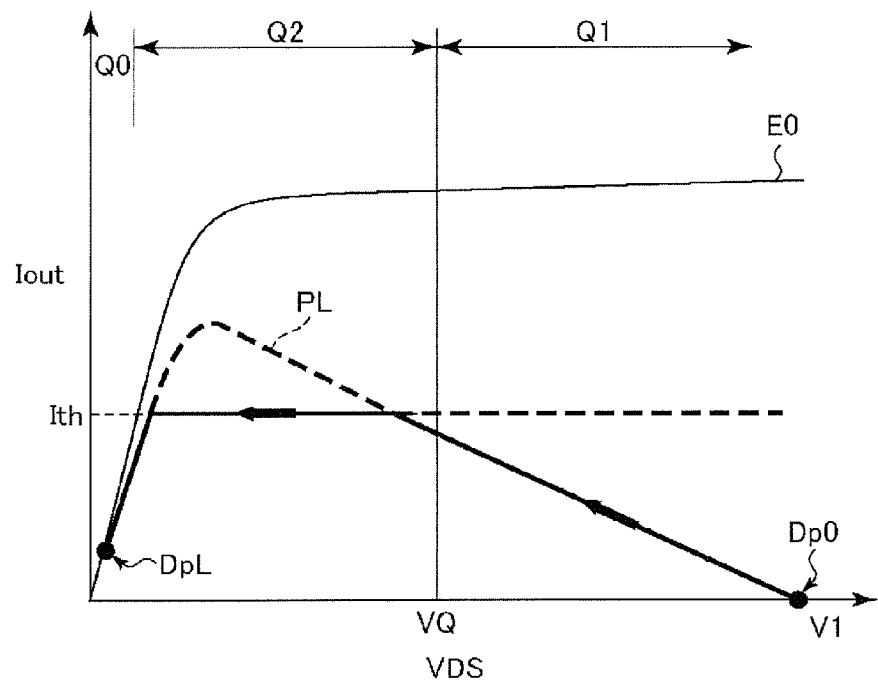
FIG. 11 is a graph showing an example operation of the semiconductor device according to the first embodiment.

First, an example in which the first embodiment is applied to a lamp load will be described as a comparative example. FIG. 11 is a graph showing an example operation of the semiconductor device according to the first embodiment. The vertical and horizontal axes, the curve E0, Q0, Q2, Q1, VQ, and Ith are similar to those in FIG. 5. A load line PL shows lamp characteristics.

As shown in the diagram, the load line PL shows a low resistance state, since an inrush current passes through the lamp in an initial state (cold state). The resistance value in the initial state is similar to that in a partially short-circuit state (load line P2 in FIG. 5). The drain-source voltage VDS of the output transistor Mout decreases as the current increases. That is, the operating point moves toward upper left on the load line PL. If a configuration, such as the semiconductor device 3 according to the first embodiment, is used, current limit (threshold Ith) is imposed on the load line PL. As a result, the operating point cannot take a value in the broken line included in the load line PL. That is, the inrush current peaks out at the threshold Ith for current limit. The disadvantages here include the following: the lamp goes on slowly; and the time required to reach the linear area (operating point DpL in the area Q0) of the characteristic E0 of the output transistor Mout takes longer and thus the power loss of the device is increased. Further, the current limit function is performed in the range in which current limit (threshold Ith) is imposed, by alternately making the overcurrent detection signal DS a high-level signal and a low-level signal. For this reason, the gate voltage of the output transistor Mout fluctuates in accordance with variations in the overcurrent detection signal DS. This fluctuation may cause noise.

Figure 12:
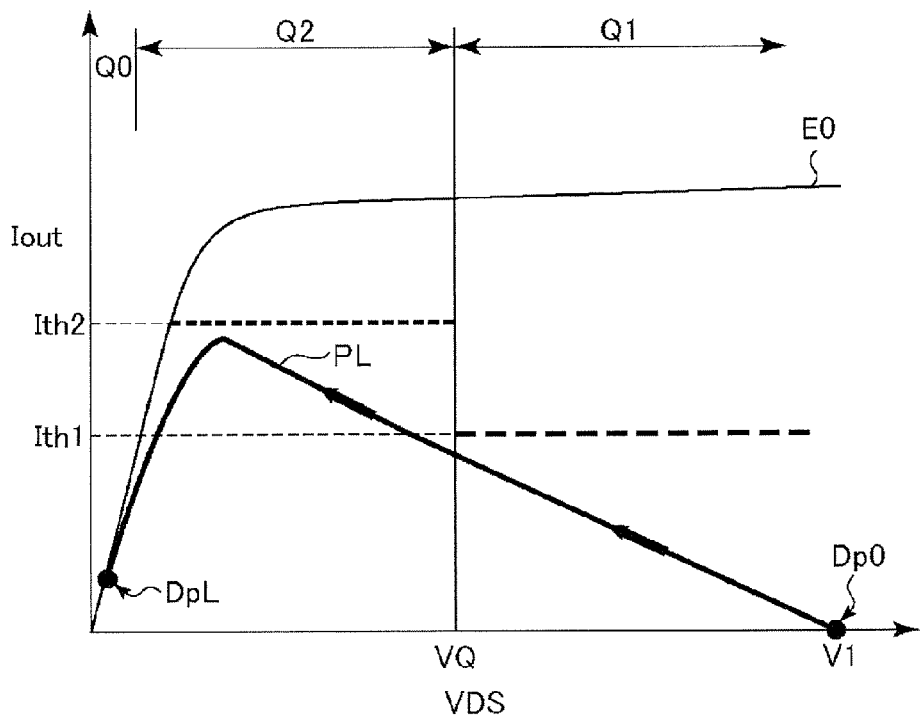
FIG. 12 is a graph showing the operation of Example of the semiconductor device according to the second embodiment.

Next, an example in which the second embodiment is applied to a lamp load will be described as Example. FIG. 12 is a graph showing the operation of Example of the semiconductor device according to the second embodiment. The vertical and horizontal axes, the curve E0, Q0, Q2, Q1, VQ, and PL are similar to those in FIG. 11. Ith2 represents the threshold for current limit (low-voltage second reference value), and the Ith1 represents the threshold for overcurrent interrupt (high-voltage second reference value).

As described above, the lamp load line PL initially indicates a low-resistance state. The resistance value is similar to that in a partially short-circuit state (load line P2 in FIG. 5). The drain-source voltage VDS of the output transistor Mout decreases as the current increases. That is, the operating point moves toward upper left on the load line PL. If a configuration, such as the semiconductor device 3 according to the second embodiment, is used, the load line PL exceeds the threshold Ith1 for overcurrent interrupt in the area Q2. However, in the area Q2, the threshold Ith1 for overcurrent interrupt has no relationship with the operation. On the other hand, the threshold Ith2 for current limit, which has a relationship with the operation, is set to a value which is greater than the threshold Ith1 for overcurrent interrupt and does not fall on the load line PL. Accordingly, the operating point is not affected by any of the thresholds and can move on the load line PL to reach the linear area (operating point DpL in the area Q0) of the characteristic E0 of the output transistor Mout.

As seen above, by setting the threshold for current limit to the value greater than the threshold for overcurrent interrupt, a lamp load (load line PL) as shown in FIG. 12 can avoid a delay in going on, an increase in the power loss of the device, possible occurrence of noise, and the like.

Figure 13:
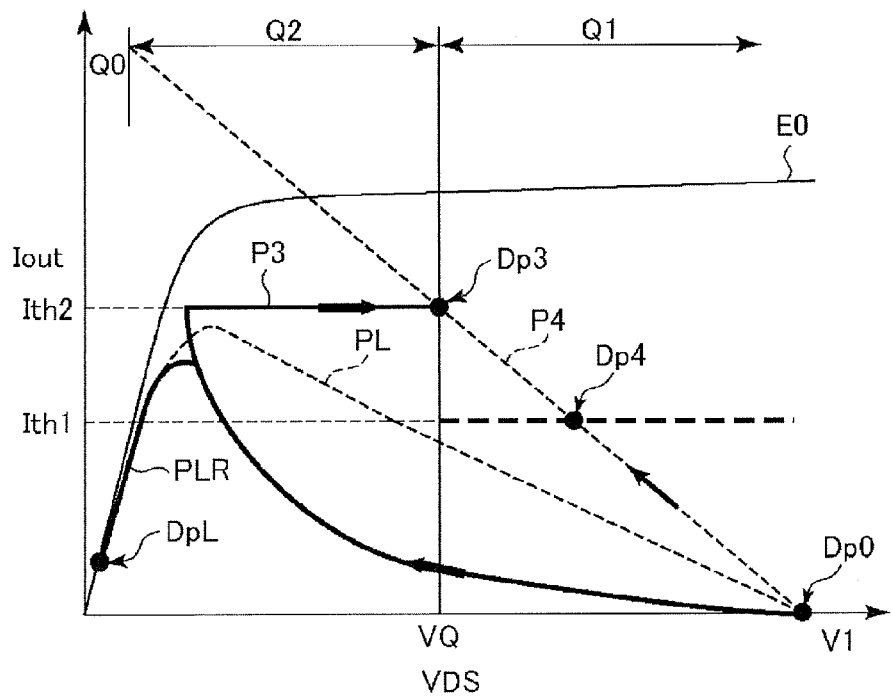
FIG. 13 is a graph showing the actual operation of Example of the semiconductor device according to the second embodiment.

Note that in Example shown in FIG. 12, it is not possible to impose current limit when the load is placed in a partially short-circuit state in the area Q2, unlike in FIG. 10. However, it is ideal for the load line PL to extend straight as in FIG. 12 (when the wiring inductance is zero). Actually, a load line PLR which is affected by the wire harness inductance is obtained. FIG. 13 is a graph showing an actual operation of Example of the semiconductor device according to the second embodiment. The vertical and horizontal axes, the curve E0, Q0, Q2, Q1, VQ, PL, Ith1, and Ith2 are similar to those in FIG. 11. The load line PLR is an actual load line obtained by considering the wiring inductance.

Ideally, a load line indicating a load short-circuit state (abnormal load) is a load line P4 (straight line) shown by a broken line. The load line P4 has a characteristic of reaching the threshold Ith1 for overcurrent interrupt at an operating point Dp4. However, due to the wiring inductance, the actual load line indicating a load short-circuit state (abnormal load) is a load line P3 (wraparound curve) shown by a solid line. If the current limit is not imposed, the load line would move upward to approach the ideal load line P4 and intersect the characteristic E0 of the output transistor Mout. Accordingly, the intersection would serve as an operating point. However, the current limit is imposed actually. Accordingly, the current peaks out at the threshold Ith2 for current limit, and the operating point moves rightward to approach the ideal load line P4 (operating point Dp3). The threshold for overcurrent interrupt (high-voltage second reference value Ith1) is less than the threshold for current limit (low-voltage second reference value Ith2). Accordingly, when the load line enters the area in which the transistor M4 is turned on (area Q1), the enable signal (first detection signal S1) is activated, operating the latch circuit 21, followed by the interruption of the output transistor Mout.

In a heavily short-circuit state, on the other hand, the wiring inductance is very small. Accordingly, the load line wraps around to a very small extent and directly reaches the threshold for overcurrent interrupt (high-voltage second reference value Ith1) (operating point Dp4). The operating point during normal operation is the operating point DpL of the actual load line PLR in the area Q0.

Third Embodiment

Next, a semiconductor device according to a third embodiment will be described. The present embodiment differs from the first embodiment, in which the semiconductor device 3 which is already placed in an abnormal load state is newly turned on, in that a new abnormal load state occurs when the semiconductor device 3 is in on-state (operational). Hereafter, the difference will be mainly described.

The configuration of the power control circuit 11 according to the present embodiment is similar to that in the first embodiment.

Figure 14:
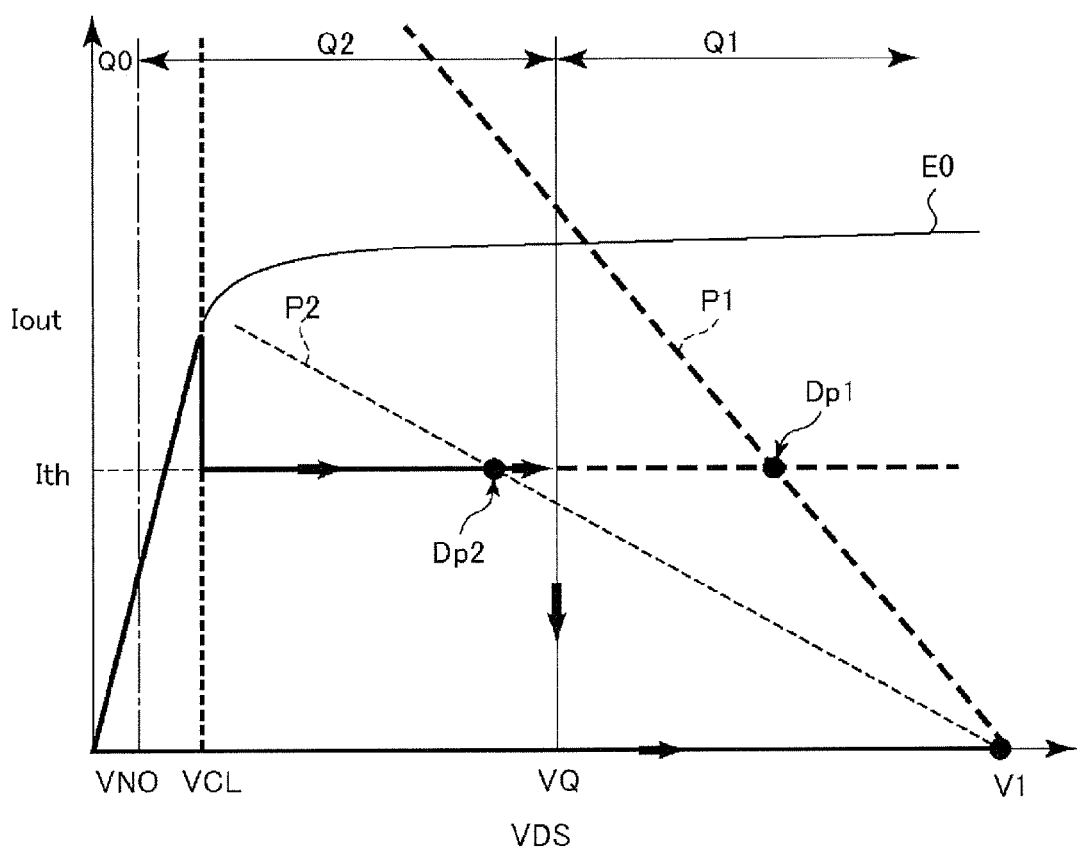
FIG. 14 is a graph showing the operation of a semiconductor device according to a third embodiment.

FIG. 14 is a graph showing the operation of the semiconductor device according to the third embodiment. The vertical and horizontal axes, the curve E0, the areas Q0, Q2, and Q1, the voltage VQ, the current threshold Ith, and the load lines P1 and P2 are similar to those in FIG. 5. The bold lines and arrows in the graph show movements of the operating point.

The first overcurrent detection unit 23 and the second overcurrent detection unit 24 are formed between the drain and source of the output transistor Mout. Accordingly, there is a limit to the drain-source voltage VDS of the output transistor Mout with which the circuits of the first overcurrent detection unit 23 and the second overcurrent detection unit 24 can operate. For example, in FIG. 14, when the semiconductor device 3 is in on-state (operational), the operating point lies in the linear area of the curve E0. That is, the operating point lies in the area Q0, and the voltage range is greater than 0 V and smaller than or equal to VNO. Even when the load in this state is heavily short-circuited with a resistance shown by the load line P1, the current limit function does not work immediately. As the drain-source voltage VDS of the output transistor Mout increases, the operating point present in the area Q0 moves toward upper right along the linear area of the curve E0 of the output transistor Mout. When the operating point reaches the drain-source voltage VDS=VCL, at which the current limit function works, the gate charge of the output transistor Mout starts to be discharged. Accordingly, the operating point approaches the threshold Ith for current limit with that voltage. That is, the output current Iout is limited to the threshold Ith for current limit. Subsequently, the drain-source voltage VDS of the output transistor Mout further increases, and the operating point reaches the drain-source voltage VDS=VQ, at which the overcurrent interrupt function works. At this time, the output transistor Mout is interrupted, and the latch circuit 21 operates. As a result, the output current Iout becomes zero.

Note that after the drain-source voltage VDS of the output transistor Mout reaches VCL, the current limit function controls the gate voltage to keep it constant by alternately turning on and off the output transistor Mout. However, rapid release of the gate charge involves concerns, including the following: the amount of variation of the gate voltage is increased and thus the output voltage V0 is formed into a saw-tooth shape. Accordingly, the discharge current when the threshold for overcurrent interrupt is reached cannot be designed so as to be so large. Typically, the gate voltage of the output transistor Mout is controlled by a voltage with which a sufficient on-resistance is obtained. For this reason, a small discharge current does not result in a graph as shown in FIG. 14. Realistically, a graph as shown in FIG. 15 is obtained.

Figure 15:
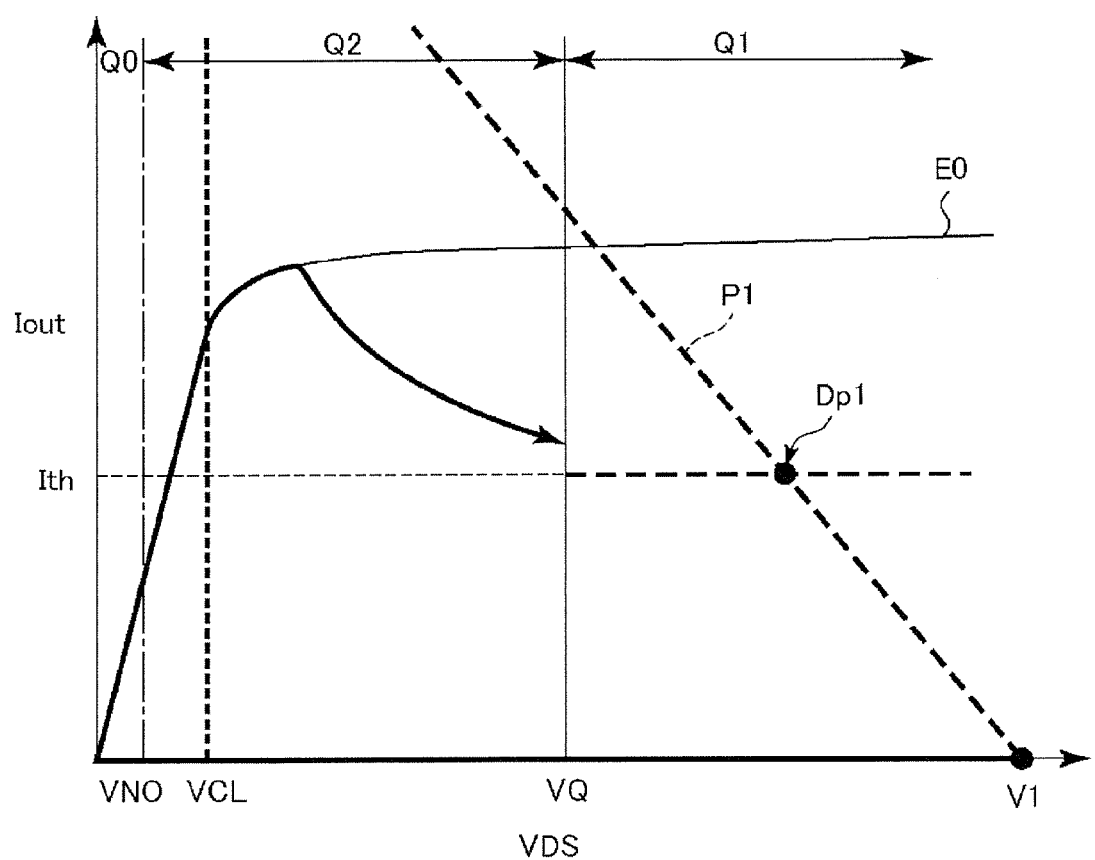
FIG. 15 is another graph showing the operation of the semiconductor device according to the third embodiment.

FIG. 15 is another graph showing the operation of the semiconductor device according to the third embodiment. The vertical and horizontal axes, the curve E0, the areas Q0, Q2, and Q1, the voltages VQ, VNO, and VCL, the current threshold Ith, and the load line P1 are similar to those in FIG. 14. The bold lines and arrows in the graph show movements of the operating point. As described above, after the drain-source voltage VDS of the output transistor Mout reaches VCL, at which the current limit function works, the gate charge of the output transistor Mout is discharged. However, the gate voltage of the output transistor Mout has been sufficiently increased. Accordingly, if the discharge current is small, the current limit function does not work immediately and therefore the operating point moves along the curve E0 for a while, as shown in this diagram. Subsequently, the operating point approaches the threshold Ith for current limit with a lapse of time. Power loss is much larger than that in FIG. 14 (the difference in area between the I-V curves). For this reason, the current may be interrupted by operating the overheat detection circuit 12 earlier before the drain-source voltage VDS of the output transistor Mout reaches VQ, at which the overcurrent interrupt function works. However, even when the drain-source voltage VDS of the output transistor Mout reaches VQ, at which the overcurrent interrupt function works, before the overheat detection circuit 12 operates, the current at this point in time is high. Accordingly, even if the current is interrupted, power loss would be large. For this reason, a quick interrupt function as shown in FIG. 16 is provided.

Figure 16:
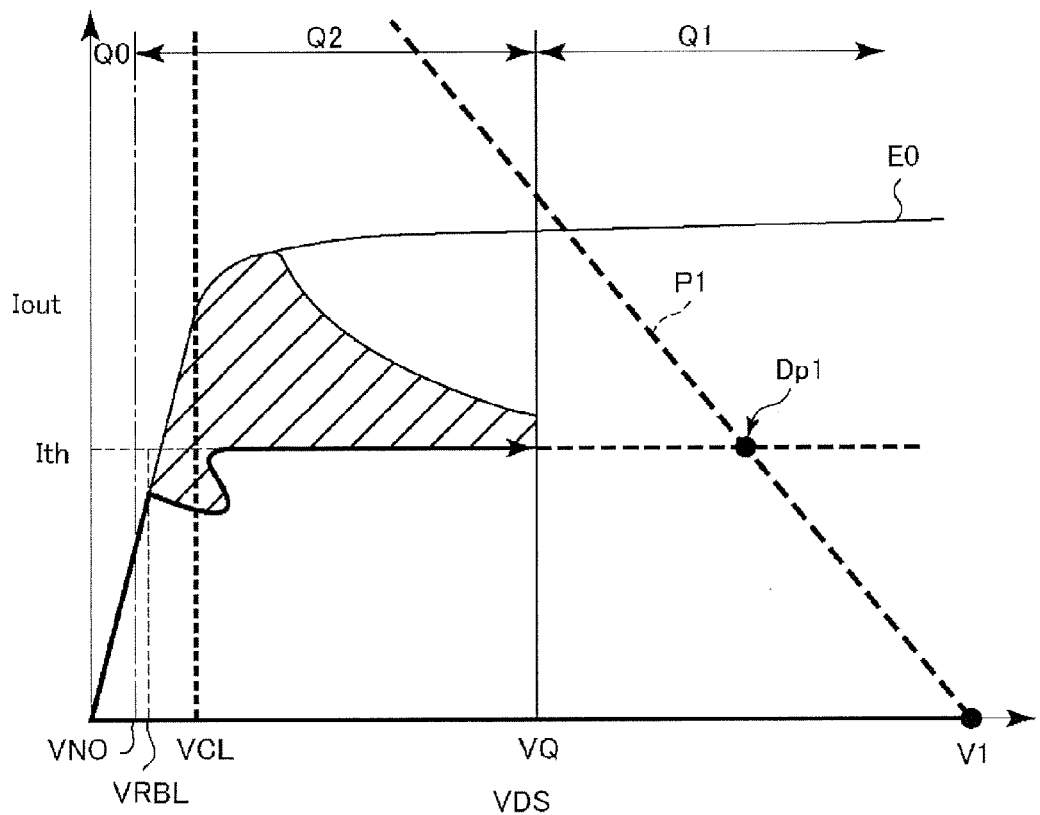
FIG. 16 is yet another graph showing the operation of the semiconductor device according to the third embodiment.

FIG. 16 is yet another graph showing the operation of the semiconductor device according to the third embodiment. The vertical and horizontal axes, the curve E0, the areas Q0, Q2, and Q1, the voltages VQ, VNO, and VCL, the current threshold Ith, and the load line P1 are similar to those in FIG. 14. The bold lines and arrows in the graph show movements of the operating point. The quick interrupt function refers to a function of, when an abnormal load (load short-circuit state) occurs and thus the drain-source voltage VDS of the output transistor Mout starts increasing and reaches a threshold VRBL for quick Interrupt, quickly discharging the gate charge of the output transistor Mout. Thus, the output transistor Mout can be turned off quickly. That is, the threshold VRBL for quick interrupt is the threshold of the drain-source voltage VDS of the output transistor Mout for interrupting the output current Iout quickly. The threshold VRBL for quick interrupt is set within a range which is greater than VNO and smaller than VCL. A threshold VRBL which is closer to VNO is preferable, since it makes power loss smaller.

In this diagram, the drain-source voltage VDS of the output transistor Mout starts increasing and then reaches the threshold VRBL for quick interrupt (for example, 30 A or equivalent). At this time, the gate charge is quickly discharged. Thus, $V_{DS}$-$I_{DS}$ characteristics of the output transistor Mout are deteriorated, reducing the current in a load short-circuit state. Subsequently, the drain-source voltage VDS of the output transistor Mout further increases. When the quick interrupt function stops (VDS is near VCL), the operating point attempts to approach the threshold Ith for current limit. Subsequently, when the drain-source voltage VDS of the output transistor Mout further increases, the operating point reaches the threshold for overcurrent interrupt and is latched there. In this case, the current value is significantly reduced compared to that in FIG. 15. As a result, power loss when turning off the output transistor Mout is reduced. Note that if the rapid discharge function continues to work, the output transistor Mout would be turned off completely. For this reason, in this diagram, the quick interrupt function is cancelled after the output voltage V0 (=Vsource) is detected to have been reduced to a certain threshold.

Figure 17:
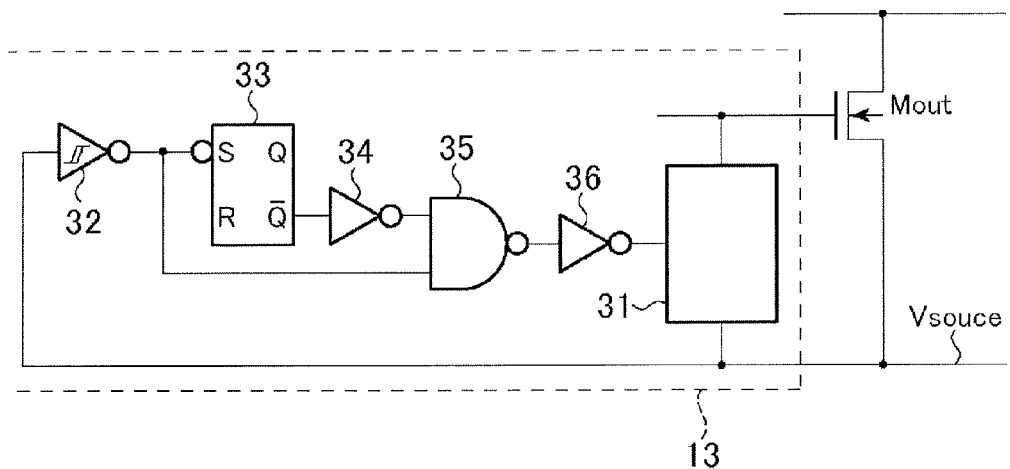
FIG. 17 is a block diagram showing the configuration of a quick interrupt control circuit according to the third embodiment.

FIG. 17 is a block diagram showing an example configuration of a quick interrupt control circuit of the semiconductor device according to the third embodiment. A quick interrupt control circuit 13 is an example of a configuration for achieving a quick interrupt function and is coupled between the gate and source of the output transistor Mout. The quick interrupt control circuit 13 includes a threshold detection unit (inverter) 32, a latch circuit (RS flip-flop) 33, inverters 34 and 36, a NAND circuit 35, and a quick interrupt circuit 31.

The threshold detection unit 32 detects that a source voltage Vsource (that is, V0 in FIG. 1) of the output transistor Mout has become smaller than or equal to a predetermined threshold for quick interrupt (low level), and the latch circuit 33 latches this state. To prevent a malfunction, the inverter 32 has hysteresis. Accordingly, the output signal output from the inverter 32 is inverted at a value which is slightly higher than the predetermined threshold for quickly interrupting the source voltage Vsource (=V0) (the threshold VRBL for quickly interrupting the drain-source voltage VDS of the output transistor Mout). The NAND circuit 35 fixes one input signal sent via the inverter 34 to a high level. Subsequently, when the drain-source voltage VDS of the output transistor Mout increases to the predetermined threshold or less (low level) due to an abnormal load or the like, both inputs to the NAND circuit 35 become a high level. Thus, the quick interrupt circuit 31 operates. The quick interrupt circuit 31 can be achieved by using circuits reported in Japanese Unexamined Patent Application Publication No. 2009-171551 (US2009160498(A1)), Japanese Unexamined Patent Application Publication No. 2011-139404 (US2011163794(A1)), and the like. Of course, other configurations can also be used to achieve the quick interrupt circuit 31.

As seen above, even if a new abnormal load state occurs when the semiconductor device 3 is in on-state (operational), the present embodiment can produce effects similar to those of the first embodiment.

Figure 18:
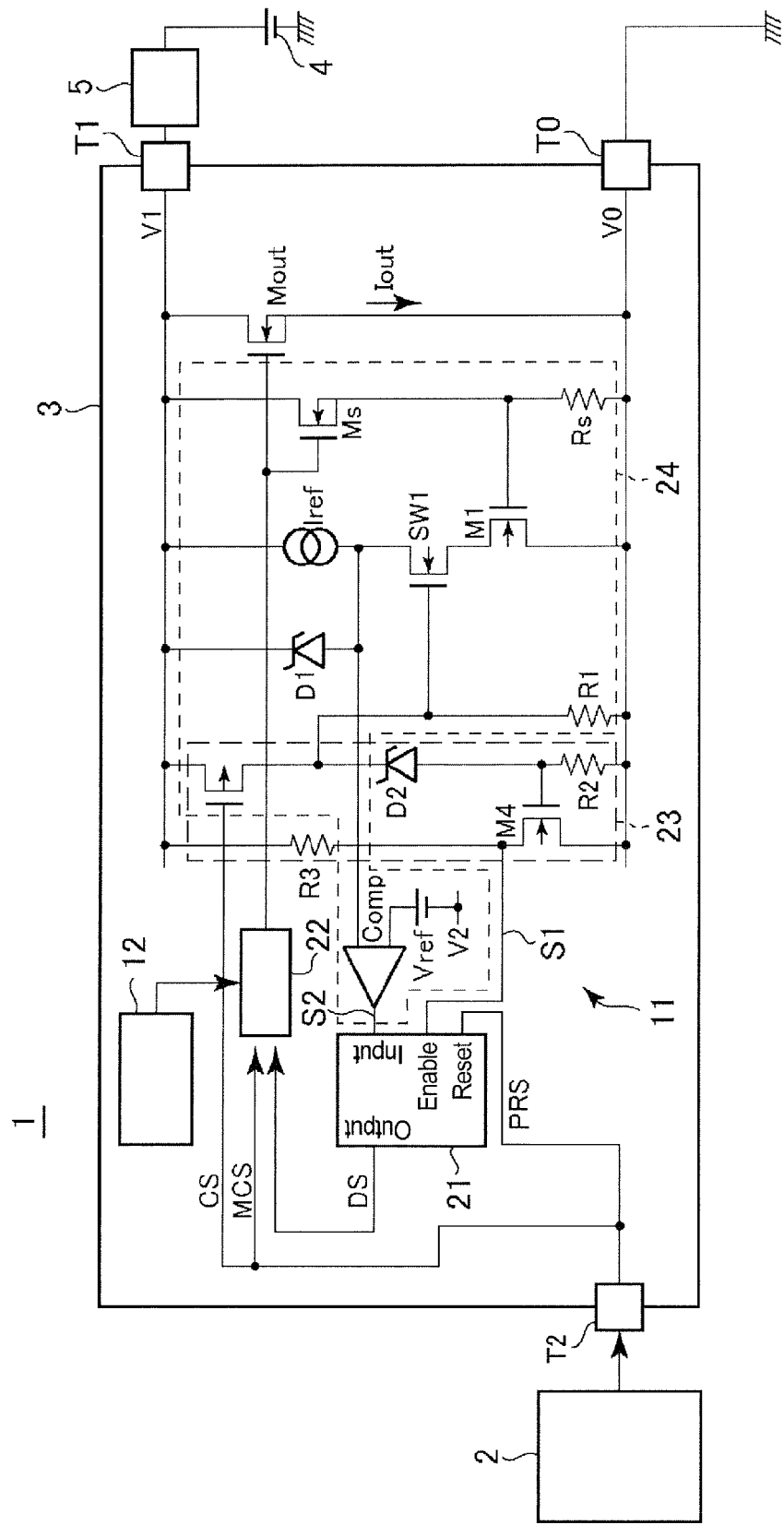
FIG. 18 is a block diagram showing another configuration of the semiconductor device and an example use thereof according to another embodiment.

In the above embodiments, the semiconductor device 3 is coupled to the high side of the load 5, as shown in FIG. 1. However, the embodiments are limited to such a configuration. For example, the semiconductor device 3 may be coupled to the low side of the load 5. FIG. 18 shows an example. FIG. 18 is a block diagram showing another configuration of the semiconductor device and an example use thereof according to the first embodiment. In this example use (electrical system 1), unlike in FIG. 1, the semiconductor device 3 is coupled to the low side of the load 5. Specifically, the semiconductor device 3 includes the terminal T2 coupled to the microcomputer 2, the first terminal T1 coupled to the load 5 and the power source 4 (via the 5), and the second terminal T0 coupled to the ground. Such a configuration also can produce effects similar to those of the above embodiments. Further, the sense resistor RS may be formed by using such as a silicon resistor, a metal resistor, and a transistor (for example, depletion type transistor). The resistors R1, R2 and R3 may typically formed by silicon resistors or using transistors. The resistors RS, R1, R2 and R3 can be formed by using another material.

While the present invention has been described in detail based on the embodiments, the invention is not limited thereto. As a matter of course, various changes can be made to the embodiments without departing from the spirit and scope of the invention.

What is claimed is:

1. A semiconductor device comprising:
   an output transistor coupled between a first terminal and a second terminal;
   a first overcurrent detection unit configured to detect whether a drain-source voltage of the output transistor is greater than or equal to a first reference value and to output a first detection signal;
   a second overcurrent detection unit configured to detect whether an output current is a second reference value, the output current being a current passing through the output transistor, and to output a second detection signal;
   a latch circuit configured to, when receiving the first detection signal indicating that the drain-source voltage is greater than or equal to the first reference value, latch the second detection signal; and
   a drive circuit configured to, based on an output of the latch circuit, control the output transistor to turn off the output transistor,
   wherein, when the latch circuit receives the first detection signal indicating that the drain-source voltage is smaller than the first reference value, the latch circuit outputs the second detection signal without latching the second detection signal, and based on the output of the latch circuit, the drive circuit controls the output transistor to turn on or off the output transistor.

2. The semiconductor device according to claim 1,
   wherein the latch circuit comprises:
   a latch unit configured to be enabled by the first detection signal and to latch the second detection signal; and
   an AND circuit configured to output an AND of an output of the latch unit and the second detection signal.

3. The semiconductor device according to claim 1,
   wherein the first overcurrent detection unit comprises:
   a diode having a cathode coupled to the first terminal;
   a first resistor coupled between an anode of the diode and the second terminal;
   a second resistor coupled to the first terminal; and
   a transistor coupled between the second resistor and the second terminal, having a gate coupled between the diode and the first resistor, and configured to be turned on when the drain-source voltage is greater than or equal to the first reference value, and wherein the first overcurrent detection unit outputs a potential between the second resistor and the transistor, as the first detection signal.

4. The semiconductor device according to claim 1, wherein the second overcurrent detection unit comprises:
   a sense transistor coupled in parallel to the output transistor with respect to the first terminal, respective gates of the sense transistor and the output transistor being coupled together;
   a sense resistor coupled between the sense transistor and the second terminal;
   a current source coupled in parallel to the sense transistor with respect to the first terminal;
   a transistor coupled between the current source and the second terminal, a gate of the transistor being coupled between the sense transistor and the sense resistor; and
   a comparator configured to compare a potential between the current source and the transistor with a predetermined potential and to output a comparison result as the second detection signal.

5. The semiconductor device according to claim 1, wherein the second reference value includes a first second reference value and a second reference value greater than the first second reference value, and wherein when the drain-source voltage is greater than the first reference value, the second overcurrent detection unit detects whether the output current is greater than or equal to the first second reference value and outputs the second detection signal, and wherein when the drain-source voltage is smaller than the first reference value, the second overcurrent detection unit detects whether the output current is greater than or equal to the second reference value and outputs the second detection signal.

6. The semiconductor device according to claim 5, wherein the second overcurrent detection unit comprises:
   a sense transistor coupled in parallel to the output transistor with respect to the first terminal, respective gates of the sense transistor and the output transistor being coupled together;
   a sense resistor coupled between the sense transistor and the second terminal;
   a first current source coupled in parallel to the sense transistor with respect to the first terminal;
   a second current source coupled in parallel to the sense transistor with respect to the first terminal and configured to function based on a signal obtained by inverting the first detection signal;
   a transistor coupled among the first and second current sources and the second terminal, a gate of the transistor being coupled between the sense transistor and the sense resistor; and
   a comparator configured to compare a potential between the first and second current sources and the transistor with a predetermined potential and to output a comparison result as the second detection signal.

7. The semiconductor device according to claim 5, wherein the second overcurrent detection unit comprises:
   a sense transistor coupled in parallel to the output transistor with respect to the first terminal, respective gates of the sense transistor and the output transistor being coupled together;
   a sense resistor coupled between the sense transistor and the second terminal;
   a current source coupled in parallel to the sense transistor with respect to the first terminal;
   a transistor coupled between the current source and the second terminal, a gate of the transistor being coupled between the sense transistor and the sense resistor;
   a third transistor coupled between the current source and the second terminal, a gate of the third transistor being coupled between the sense transistor and the sense resistor, the third transistor being configured to function when the first detection signal is output; and
   a comparator configured to compare a potential between the current source, and the transistor and third transistor with a predetermined potential and to output a comparison result as the second detection signal.

8. The semiconductor device according to claim 1, further comprising
   a quick interrupt control unit configured to, in response to a source voltage of the output transistor becoming less than or equal to a predetermined threshold, quickly discharging gate charge of the output transistor.

9. The semiconductor device according to claim 1, wherein a load is coupled to one of the first terminal and the second terminal.

10. An electrical system comprising:
    a power source;
    a load;
    a microcomputer; and
    the semiconductor device according to claim 1, the semiconductor device being either coupled to the power source, the load, and the microcomputer or coupled to the load coupled to the power source and to the microcomputer and configured to control power supply from the power source to the load based on the control of the microcomputer.

11. A method for operating a semiconductor device, comprising:
    detecting whether a drain-source voltage of an output transistor coupled between a first terminal and a second terminal is greater than or equal to a first reference value and outputting a first detection signal;
    detecting whether an output current is greater than or equal to a second reference value, the output current being a current passing through the output transistor, and outputting a second detection signal;
    when receiving the first detection signal indicating that the drain-source voltage is greater than or equal to the first reference value, latching the second detection signal;
    based on the latched second detection signal, controlling the output transistor to turn off the output transistor;
    when receiving the first detection signal indicating that the drain-source voltage is smaller than the reference value, outputting the second detection signal without latching the second detection signal; and
    based on the second detection signal output without being latched, controlling the output transistor to turn on or off the output transistor.

* * * * *